US012707653B2

(12) United States Patent
Cheng et al.

(10) Patent No.: US 12,707,653 B2
(45) Date of Patent: Aug. 11, 2026

(54) THICK REDISTRIBUTION LAYER FEATURES

(71) Applicant: Taiwan Semiconductor Manufacturing Company, Ltd., Hsinchu (TW)

(72) Inventors: Chia-Feng Cheng, Tainan City (TW); Kang-Yi Lien, Tainan City (TW); Chia-Ping Lai, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 591 days.

(21) Appl. No.: 18/184,480

(22) Filed: Mar. 15, 2023

(65) Prior Publication Data

US 2024/0088074 A1 Mar. 14, 2024

Related U.S. Application Data

(60) Provisional application No. 63/405,105, filed on Sep. 9, 2022.

(51) Int. Cl.
*H01L 23/498* (2006.01)
*G11C 5/06* (2006.01)
(Continued)

(52) U.S. Cl.
CPC ............. *H10D 1/042* (2025.01); *H10D 1/716* (2025.01); *H10W 72/01235* (2026.01);
(Continued)

(58) Field of Classification Search
CPC ..... H01L 21/823475; H01L 21/823871; H01L 21/76885; H01L 21/76895; H01L 21/76897; H01L 21/76804; H01L 21/76805; H01L 21/76816; H01L 21/76877; H01L 23/5226; H01L 23/5283; H01L 23/5286; H01L 23/525; H01L 23/528; H01L 23/481; H01L 23/535; H01L 23/5384; H10W 90/726; H10W 90/736; H10W 90/737; H10W 90/756;
(Continued)

(56) References Cited

U.S. PATENT DOCUMENTS 11,114,373 B1 9/2021 Hsiao
11,145,564 B2 * 10/2021 Huang .................... H01L 24/16
(Continued)

FOREIGN PATENT DOCUMENTS

CN 114927463 A * 8/2022 ....... H01L 21/76885
TW 201725738 A 7/2017
(Continued)

*Primary Examiner* — Wael M Fahmy
*Assistant Examiner* — Aneesa Riaz Baig
(74) *Attorney, Agent, or Firm* — HAYNES AND BOONE, LLP

(57) ABSTRACT

Semiconductor structures and method of forming the same are provided. A semiconductor structure according to the present disclosure includes a metal feature in a dielectric layer, a passivation structure over the dielectric layer and the metal feature, a contact pad over the passivation structure, and a plurality of contact vias extending through the passivation structure and in contact with the metal feature and the contact pad.

20 Claims, 27 Drawing Sheets

(51) Int. Cl.

| | |
|---|---|
| ***H01L 21/768*** | (2006.01) |
| ***H01L 23/00*** | (2006.01) |
| ***H01L 23/495*** | (2006.01) |
| ***H10B 51/10*** | (2023.01) |
| ***H10B 51/20*** | (2023.01) |
| ***H10D 1/00*** | (2025.01) |
| ***H10D 1/68*** | (2025.01) |
| ***H10D 30/01*** | (2025.01) |
| ***H10D 30/47*** | (2025.01) |
| ***H10D 62/85*** | (2025.01) |
| ***H10D 64/64*** | (2025.01) |
| ***H10H 20/852*** | (2025.01) |
| ***H10H 20/857*** | (2025.01) |
| ***H10W 72/00*** | (2026.01) |
| ***H10W 72/20*** | (2026.01) |
| ***H10W 72/50*** | (2026.01) |
| ***H10W 72/59*** | (2026.01) |
| ***H10W 72/90*** | (2026.01) |

(52) U.S. Cl.
CPC .... *H10W 72/01257* (2026.01); *H10W 72/019* (2026.01); *H10W 72/01935* (2026.01); *H10W 72/242* (2026.01); *H10W 72/252* (2026.01); *H10W 72/923* (2026.01); *H10W 72/934* (2026.01); *H10W 72/9415* (2026.01); *H10W 72/952* (2026.01); *H10W 72/981* (2026.01)

(58) Field of Classification Search
CPC ............. H10W 90/757; H10W 90/766; H10W 90/767; H10W 90/796; H10W 90/288; H10W 70/60; H10W 70/62; H10W 70/635; H10W 70/63; H10W 70/685; H10W 70/211
See application file for complete search history.

(56) References Cited

U.S. PATENT DOCUMENTS

| | | | | |
|---|---|---|---|---|
| 11,145,592 | B2 | 10/2021 | Shen | |
| 11,189,538 | B2 * | 11/2021 | Huang | H01L 24/03 |
| 11,424,319 | B2 | 8/2022 | Shen | |
| 2008/0157362 | A1 | 7/2008 | Chang | |
| 2010/0224960 | A1 * | 9/2010 | Fischer | H01L 23/5223 257/532 |
| 2011/0108951 | A1 | 5/2011 | Cho | |
| 2013/0113096 | A1 * | 5/2013 | Okumura | H01L 23/3114 257/737 |
| 2016/0372537 | A1 | 12/2016 | Kawashima | |
| 2017/0179059 | A1 * | 6/2017 | Yao | H01L 24/81 |
| 2018/0019199 | A1 * | 1/2018 | Xiao | H01L 21/76871 |
| 2018/0233466 | A1 * | 8/2018 | Yen | H01L 24/03 |
| 2020/0006183 | A1 * | 1/2020 | Huang | H01L 24/08 |
| 2020/0381444 | A1 * | 12/2020 | Kuki | G11C 5/06 |
| 2021/0091034 | A1 | 3/2021 | Wang | |
| 2021/0098399 | A1 | 4/2021 | Huang | |
| 2022/0216143 | A1 * | 7/2022 | Yang | H01L 24/14 |

FOREIGN PATENT DOCUMENTS

| | | | |
|---|---|---|---|
| TW | 201926438 | A | 7/2019 |
| TW | 202230552 | A | 8/2022 |

* cited by examiner

THICK REDISTRIBUTION LAYER FEATURES

PRIORITY DATA

The present application claims the benefit of U.S. Provisional Application No. 63/405,105, filed Sep. 9, 2022, the entirety of which is herein incorporated by reference.

BACKGROUND

A redistribution layer (RDL) includes at least one metal layer to redistribute input/output (I/O) pads of an integrated circuit (IC) chip. A metal feature in an RDL layer may therefore come between an interconnect structure and a solder bump. A lot of efforts have been devoted to reinforcing and protecting metal features in the RDL from being damaged by stress generated at the solder bump.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
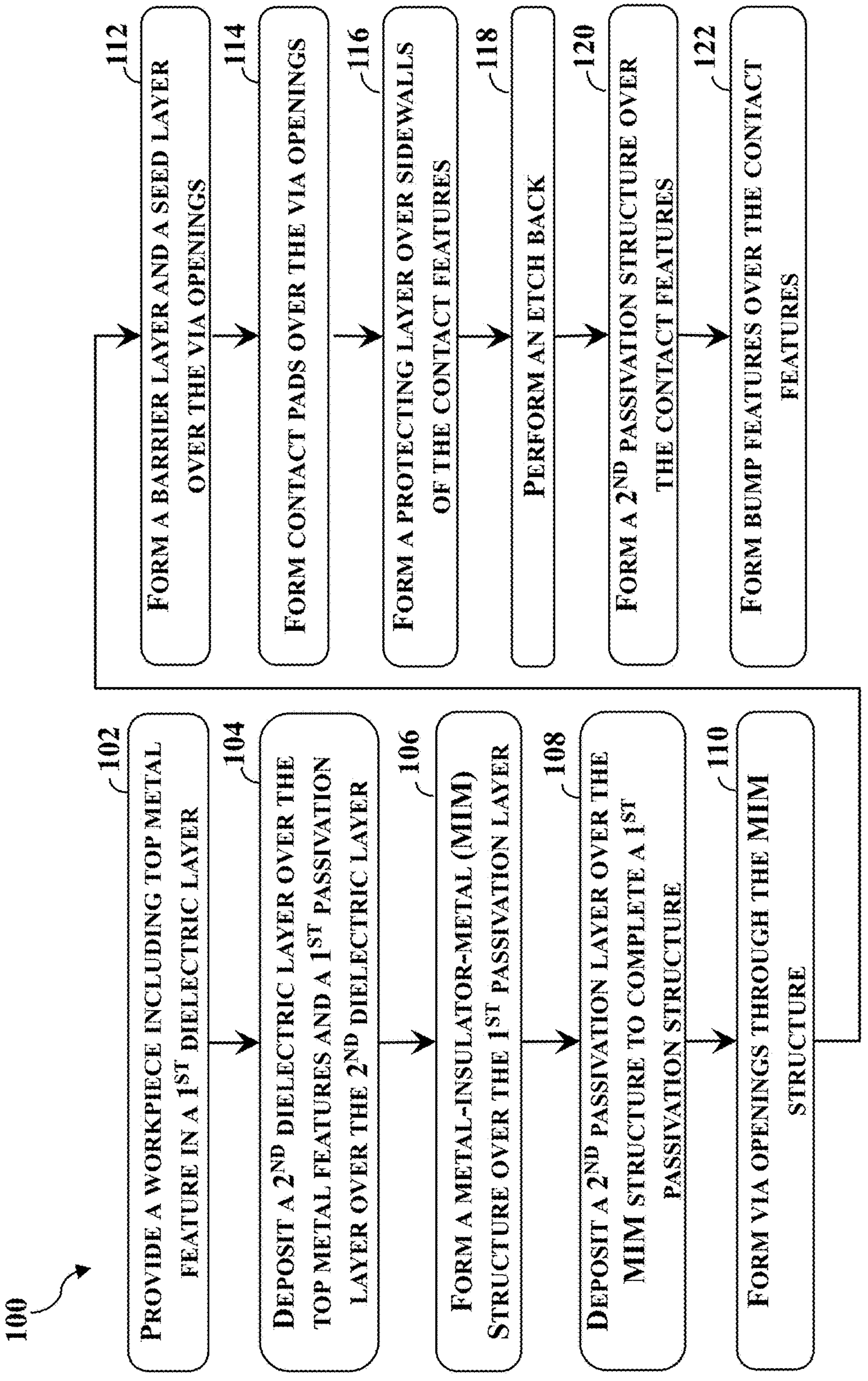
FIG. 1 is a flow chart of a method for fabricating a semiconductor structure in accordance with various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In integrated circuit (IC) fabrication, a redistribution layer (RDL) refers to an additional metal layer over a die to move input/output (I/O) pads of devices in the die to different locations for improved access or connection. In some instances, an I/O pad is part of the RDL and is disposed between an overlying solder feature and an underlying contact via extending through a passivation structure. The contact via may land on a top metal layer of an interconnect structure. It has been observed that the stress generated around the solder feature may cause defects near or around this vertical stack structure.

The present disclosure provides a semiconductor structure to prevent or reduce defects or failures around a RDL contact feature. In one aspects, an RDL contact feature of the present disclosure is much thicker than a top metal layer of an interconnect structure to reduce stress exerted on the underlying contact via and passivation structure. The RDL contact feature may also include a wider base to distribute stress. In another aspects, sidewalls of the RDL contact feature are lined with a high density protective layer to prevent collapse of the RDL contact feature. In yet another aspect, an RDL contact feature of the present disclosure is electrically coupled to a top metal layer of an interconnect structure by more than one contact via. Despite use of barrier layers, electromigration still threatens integrity of contact vias. The additional redundant contact via(s) becomes necessary to ensure electrical connection. In still another aspect, the passivation structure includes a metal-insulator-metal (MIM) structure. The MIM structure is sandwiched between two passivation layers formed of silicon nitride to provide the MIM structure with better protection.

The various aspects of the present disclosure will now be described in more detail with reference to the figures. In that regard, FIG. 1 is a flowchart illustrating a method 100 for fabricating a semiconductor structure according to embodiments of the present disclosure. The method 100 is merely an example and is not intended to limit the present disclosure to what is explicitly illustrated in the method 100. Additional steps can be provided before, during, and after the method 100, and some steps described herein can be replaced, eliminated, or moved around for additional embodiments of the method. Not all steps are described herein in detail for reasons of simplicity. The method 100 is described below in conjunction with FIGS. 2-24, which are fragmentary cross-sectional views of a workpiece 200 at different stages of fabrication of method 100 in FIG. 1. Because the workpiece 200 will be fabricated into a semiconductor structure, the workpiece 200 may be referred to herein as a semiconductor structure 200 as the context requires. Throughout the present disclosure, like reference numerals denote like features, unless otherwise expressly excepted.

Figure 2:
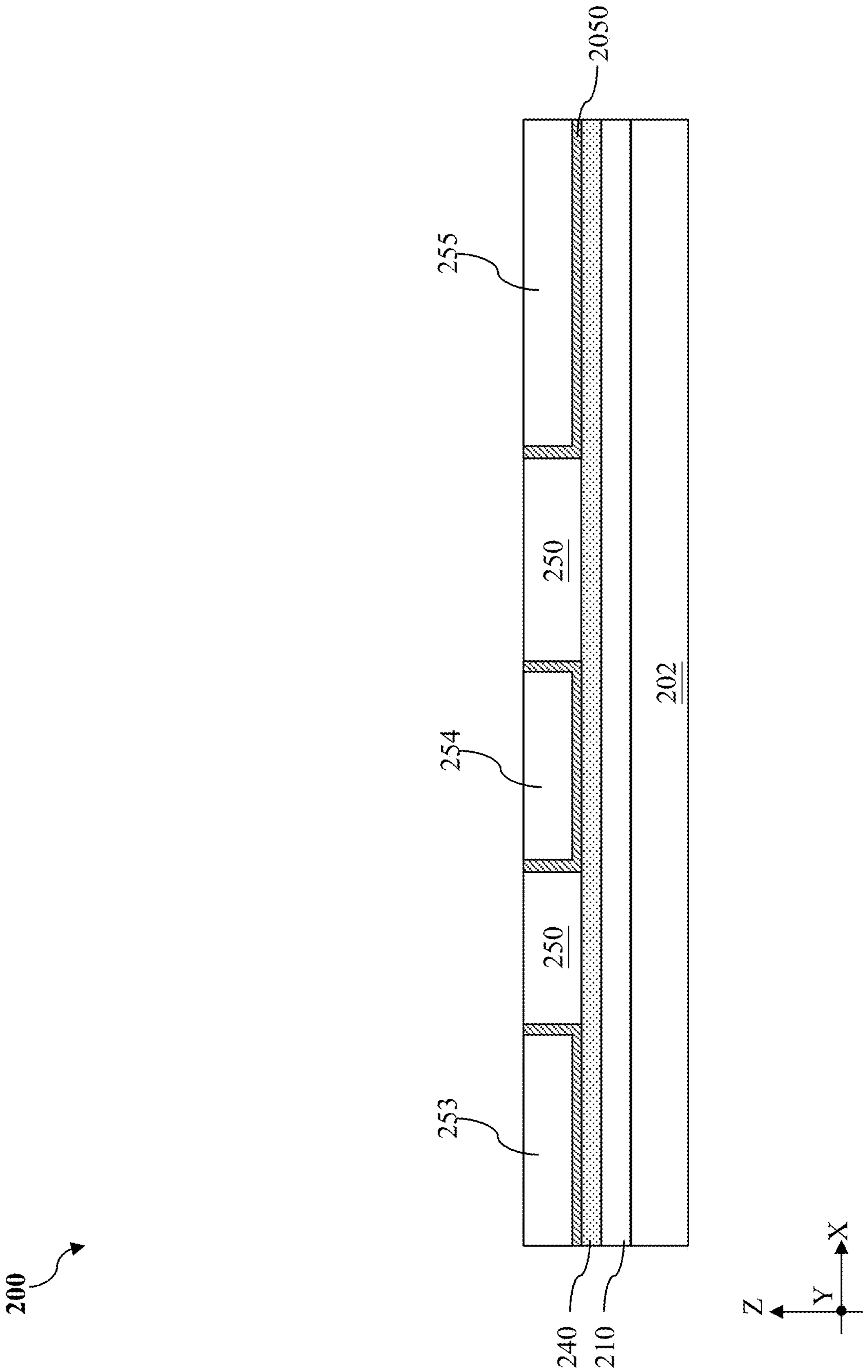
FIGS. 2-23 are fragmentary cross-sectional views of a workpiece at various stages of fabrication in the method in FIG. 1, according to embodiments of the present disclosure.

Referring to FIGS. 1 and 2, method 100 includes a block 102 where a workpiece 200 is provided. The workpiece 200 includes various layers already formed thereon. The workpiece 200 includes a substrate 202, which may be made of silicon (Si) or other semiconductor materials, such as germanium (Ge) or silicon germanium (SiGe). In some embodiments, the substrate 202 may include a compound semiconductor, such as silicon carbide (SiC), silicon phosphide (SiP), gallium arsenide (GaAs), gallium phosphide (GaP), indium phosphide (InP), indium arsenide (InAs), indium antimonide (InSb), zinc oxide (ZnO), zinc selenide (ZnSe), zinc sulfide (ZnS), zinc telluride (ZnTe), cadmium selenide (CdSe), cadmium sulfide (CdS), and/or cadmium telluride (CdTe); an alloy semiconductor, such as silicon germanium (SiGe), silicon phosphorus carbide (SiPC), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); other group III-V materials; other group II-V materials; or combinations thereof. Alternatively, substrate 202 is a semiconductor-on-insulator substrate, such as a silicon-on-insulator (SOI) substrate or a germanium-on-insulator (GeOI) substrate. In some embodiments, the substrate 202 may include an epitaxial layer, for example an epitaxial layer overlying a bulk semiconductor substrate. Various microelectronic components may be formed in or on the substrate 202, such as transistor components that include source/drain features, gate structures, gate spacers, source/drain contacts, gate contacts, isolation structures including shallow trench isolation (STI), or any other suitable components. Transistors formed on the substrate 202 may include multi-gate devices, such as fin-type field effect transistors (FinFETs) or multi-bridge-channel (MBC) transistors. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. Due to shapes of the channel regions, an MBC transistor may also be referred to as a nanowire transistor, a nanosheet transistor, or a nanorod transistor.

The workpiece 200 also includes an interconnect structure 210. The interconnect structure 210 may also be referred to as a multi-layered interconnect (MLI) structure and is formed over the substrate 202. The interconnect structure 210 may include multiple patterned dielectric layers and conductive layers that provide interconnections (e.g., wiring) between the various microelectronic components of the workpiece 200. While the interconnect structure 210 may include eight (8) to sixteen (16) metal layers, its thickness may still be substantially smaller than that of the substrate 202. The multiple patterned dielectric layers may be referred to as intermetal dielectric (IMD) layers and may include silicon oxide or low-k dielectric material whose k-value (dielectric constant) is smaller than that of silicon oxide, which is about 4. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof. The conductive layers in the interconnect structure 210 may include contacts, vias, or metal lines.

A shown in FIG. 2, the workpiece 200 may include an etch stop layer (ESL) 240 disposed on the interconnect structure 210. The ESL 240 may include silicon carbonitride (SiCN), silicon oxycarbide (SiOC), silicon carbide (SiC), silicon oxycarbonitride (SiOCN), or silicon nitride (SiN), or combinations thereof. The workpiece 200 further includes a first dielectric layer 250 disposed on the ESL 240. In some embodiments, the first dielectric layer 250 includes undoped silica glass (USG) or silicon oxide. In some embodiments, the first dielectric layer 250 is about 800 to about 1000 nm thick.

Referring still to FIG. 2, the workpiece 200 includes one or more top metal contacts (such as 253, 254, and 255) in the first dielectric layer 250. Although the top metal contacts 253, 254, and 255 are not the topmost contact features in the workpiece 200, they are referred to as top metal (TM) contacts because they are the topmost metal contacts of the interconnect structure 210. Each of the top metal contacts 253, 254, and 255 may include a barrier layer 2050 and a metal fill layer. In some embodiments, the barrier layer 2050 includes titanium nitride (TiN), tantalum (Ta), titanium (Ti), tantalum nitride (TaN), a suitable metal, a suitable metal nitride, or combinations thereof. In some embodiments, the metal fill layer includes a metal or metal alloy such as copper (Cu), cobalt (Co), nickel (Ni), aluminum (Al), tungsten (W), ruthenium (Ru), titanium (Ti), or combinations thereof. In the depicted embodiment, the top metal contacts 253, 254, and 255 are formed of copper (Cu).

Figure 3:
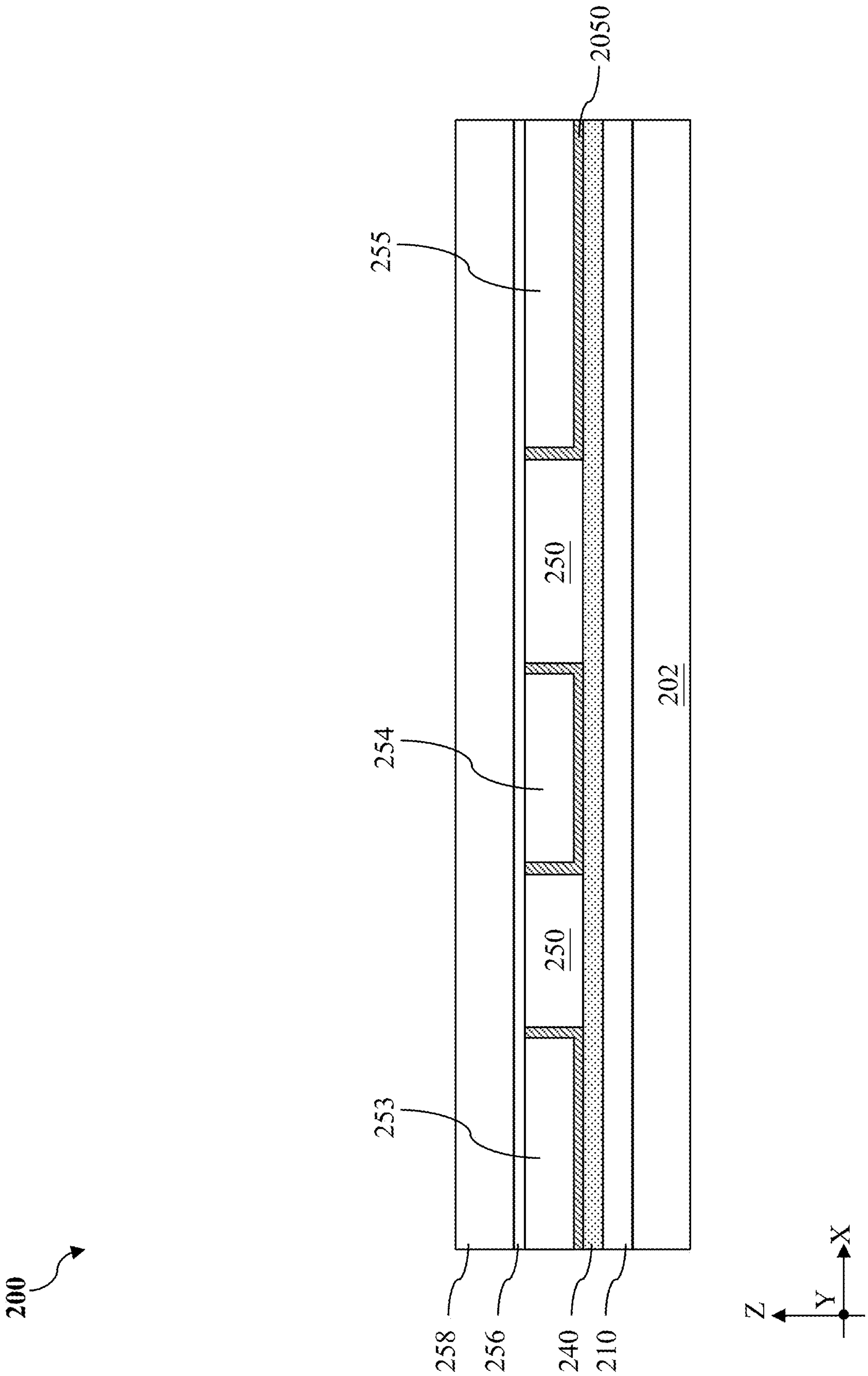

Referring to FIGS. 1 and 3, method 100 includes a block 104 where a second dielectric layer 256 and a first passivation layer 258 are deposited over the top metal contacts 253, 254, and 255. In some embodiments, the second dielectric layer 256 is about 65 to about 85 nm thick. The second dielectric layer 256 may include silicon carbonitride (SiCN), silicon nitride (SiN), and/or or other suitable materials that may protect the top metal contacts 253, 254, and 255 from being oxidized. The second dielectric layer 256 may be deposited using chemical vapor deposition (CVD). Also, at block 104, a first passivation layer 258 is deposited over the second dielectric layer 256. The first passivation layer 258 may include silicon nitride and may be deposited using plasma-enhanced CVD (PECVD). Gaseous precursors used to form the first passivation layer 258 may include ammonia (NH 3), silane (SiH 4), and nitrogen (N 2). In some implementations, the first passivation layer 258 may be deposited at a process temperature between about 375° C. and about 425° C. and a process pressure between about 2.6 Torr and about 3.0 Torr. Compared to silicon oxide containing materials deposited using spin-on coating or flowable CVD, silicon nitride in the first passivation layer 258 has a greater density and may better protect the overlying MIM structure 260 (to be described below) from stress related defects. In some examples, the first passivation layer 258 has a thickness between about 5000 nm and about 15000 nm.

Figure 4:
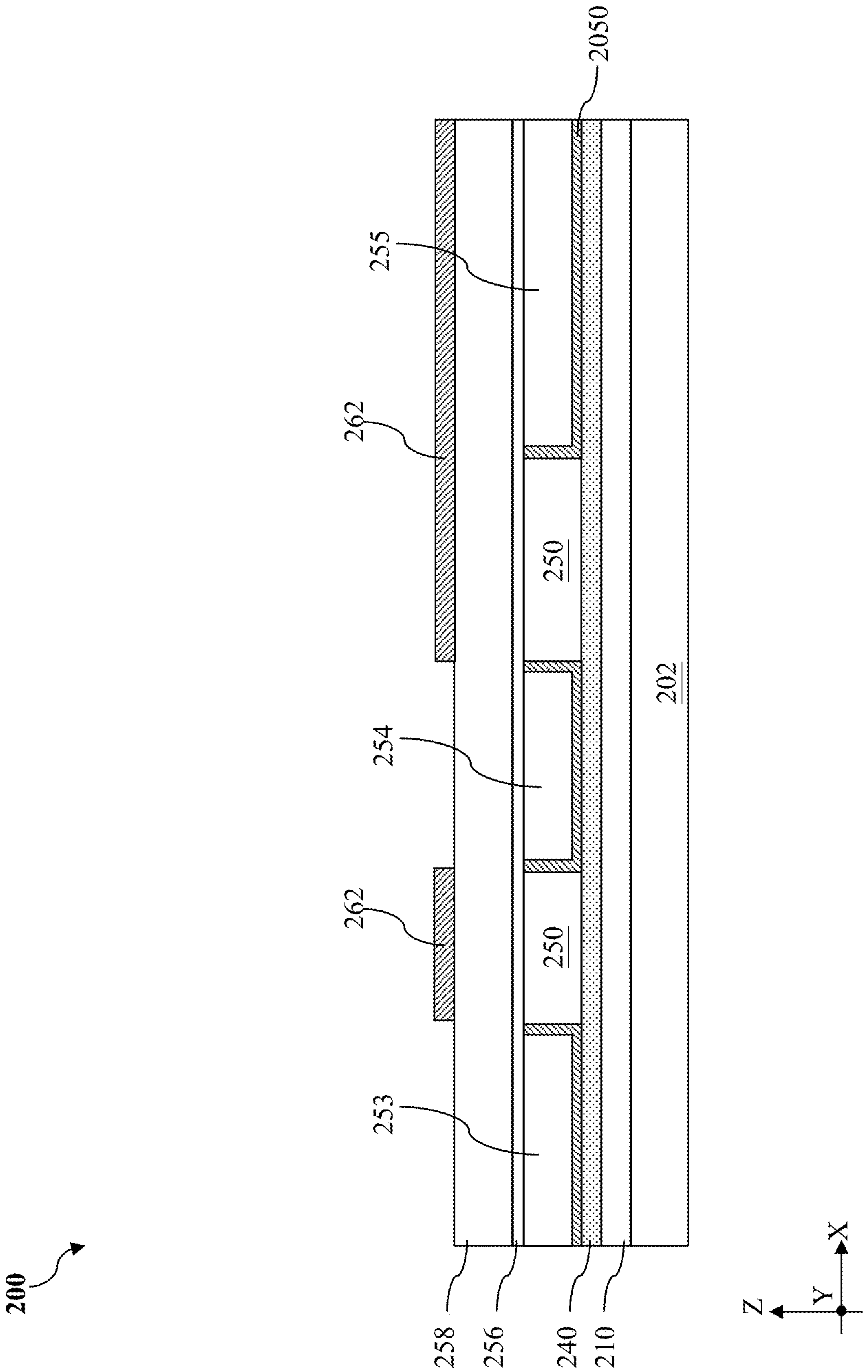
Figure 5:
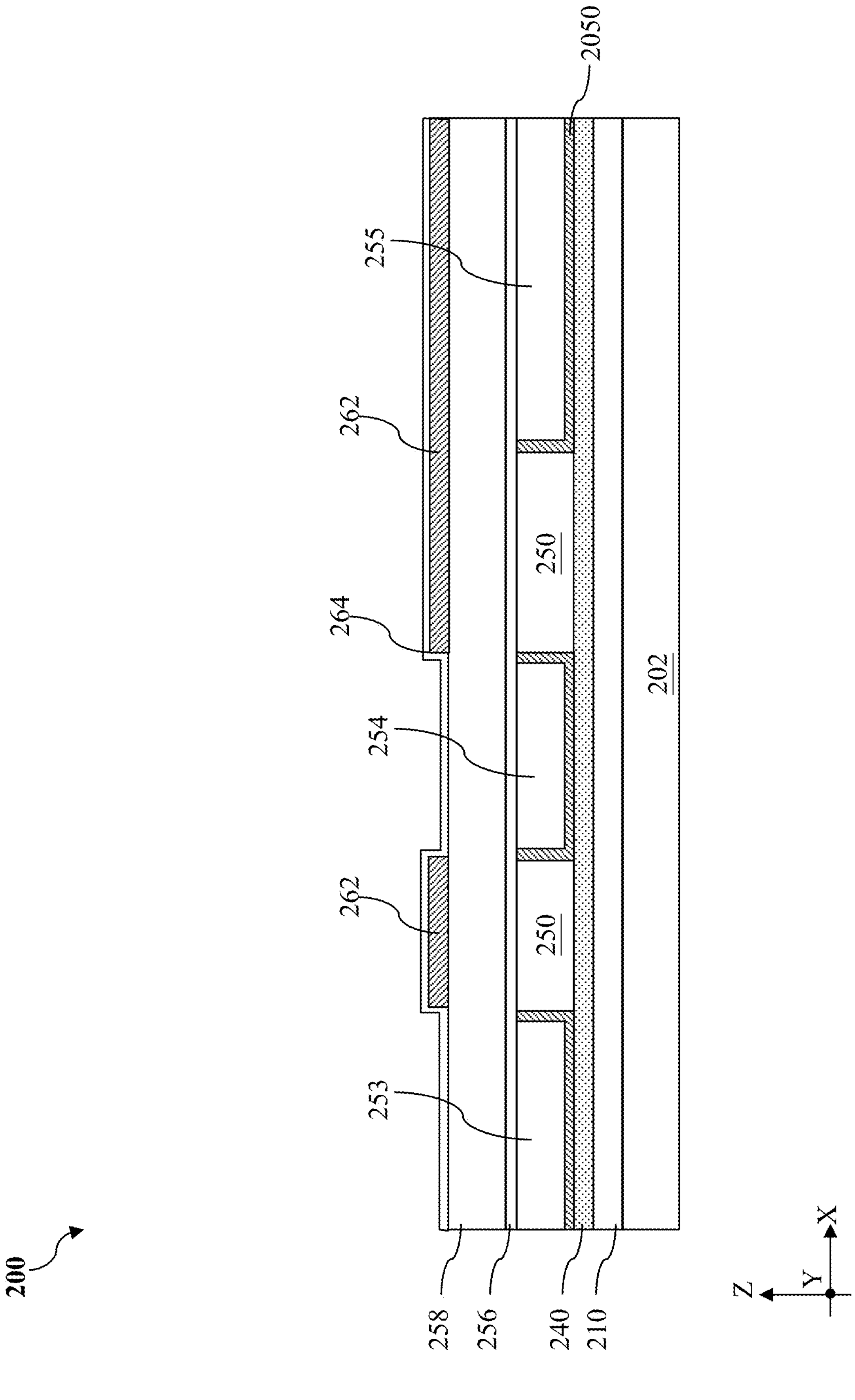
Figure 6:
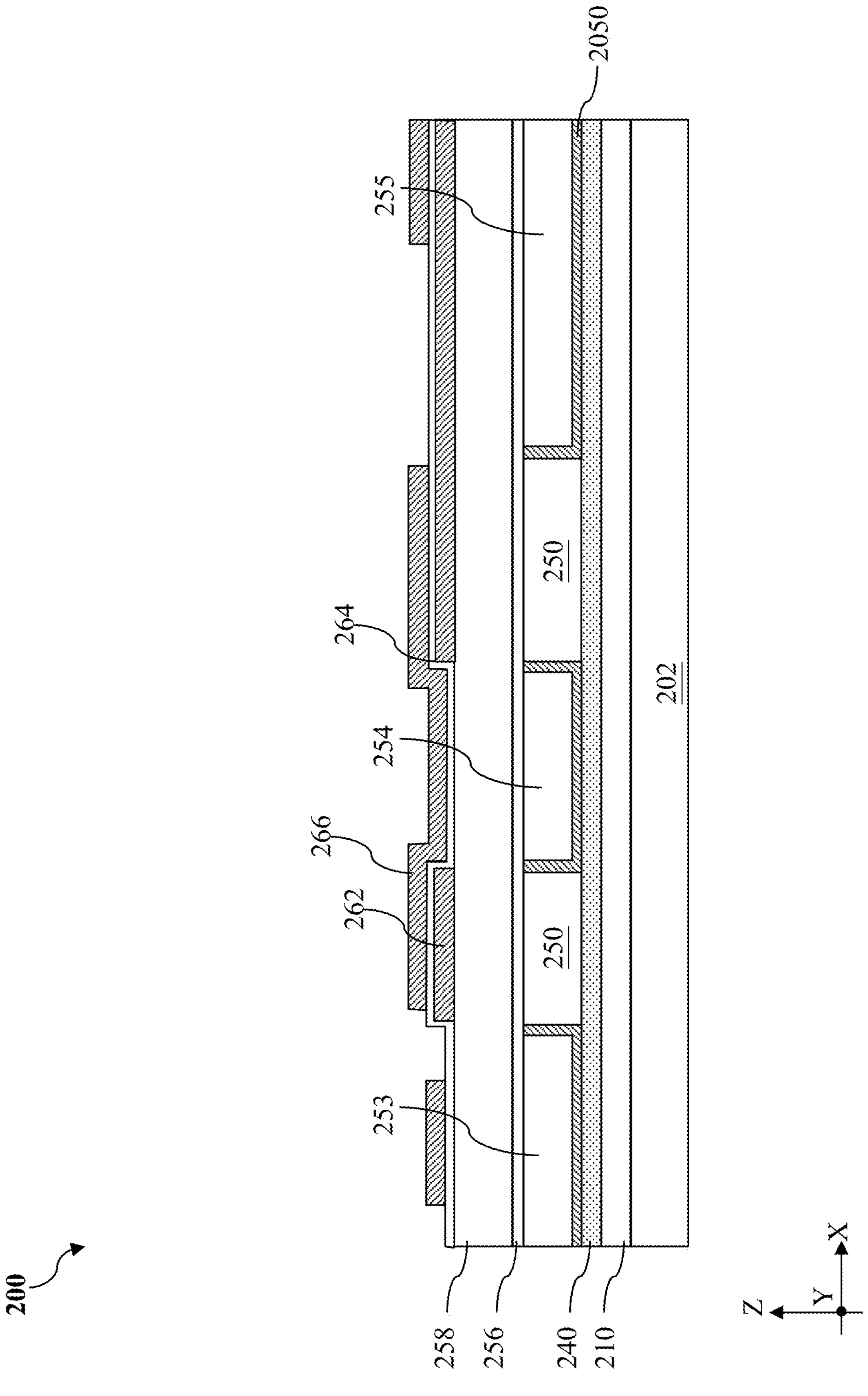
Figure 7:
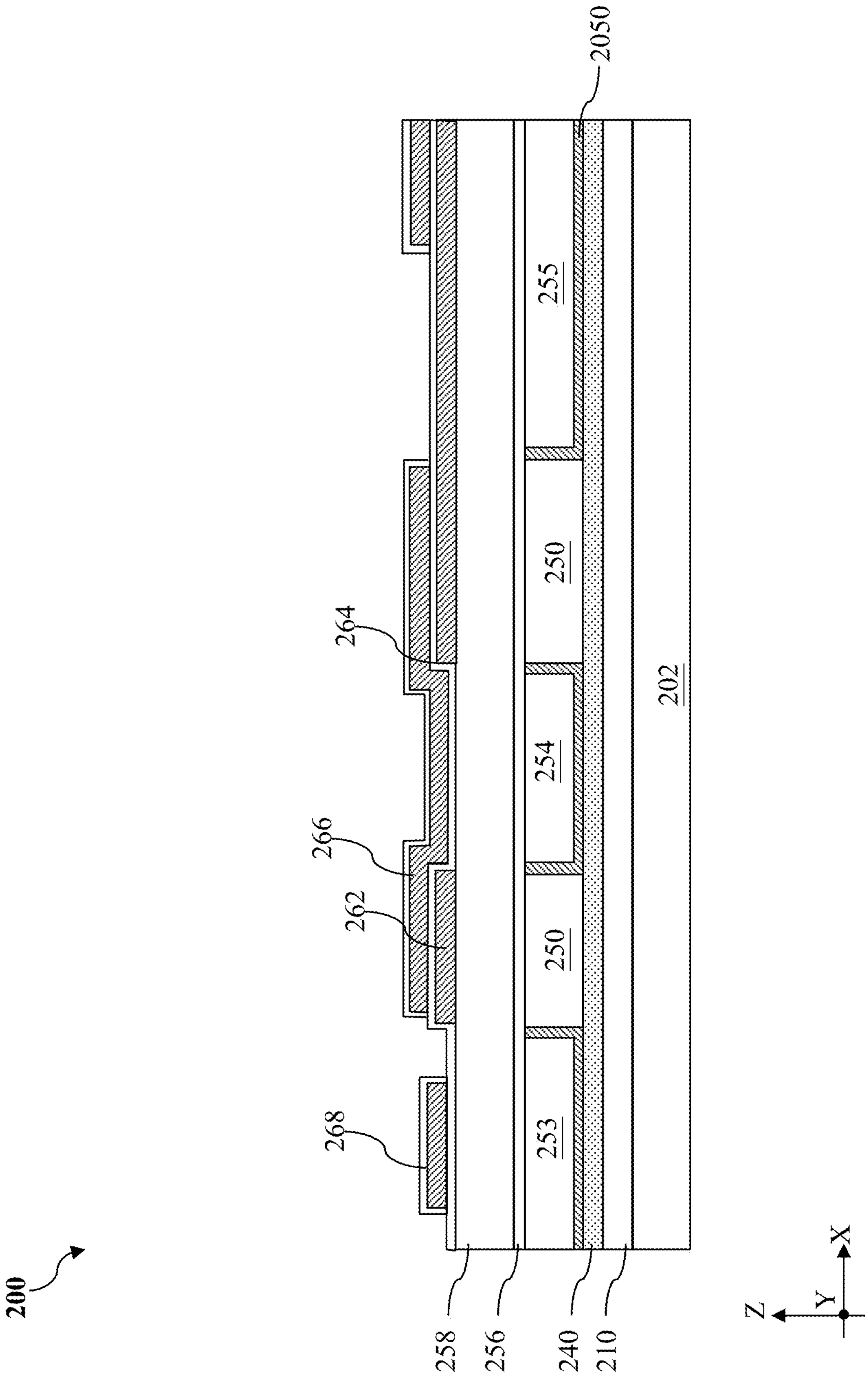
Figure 8:
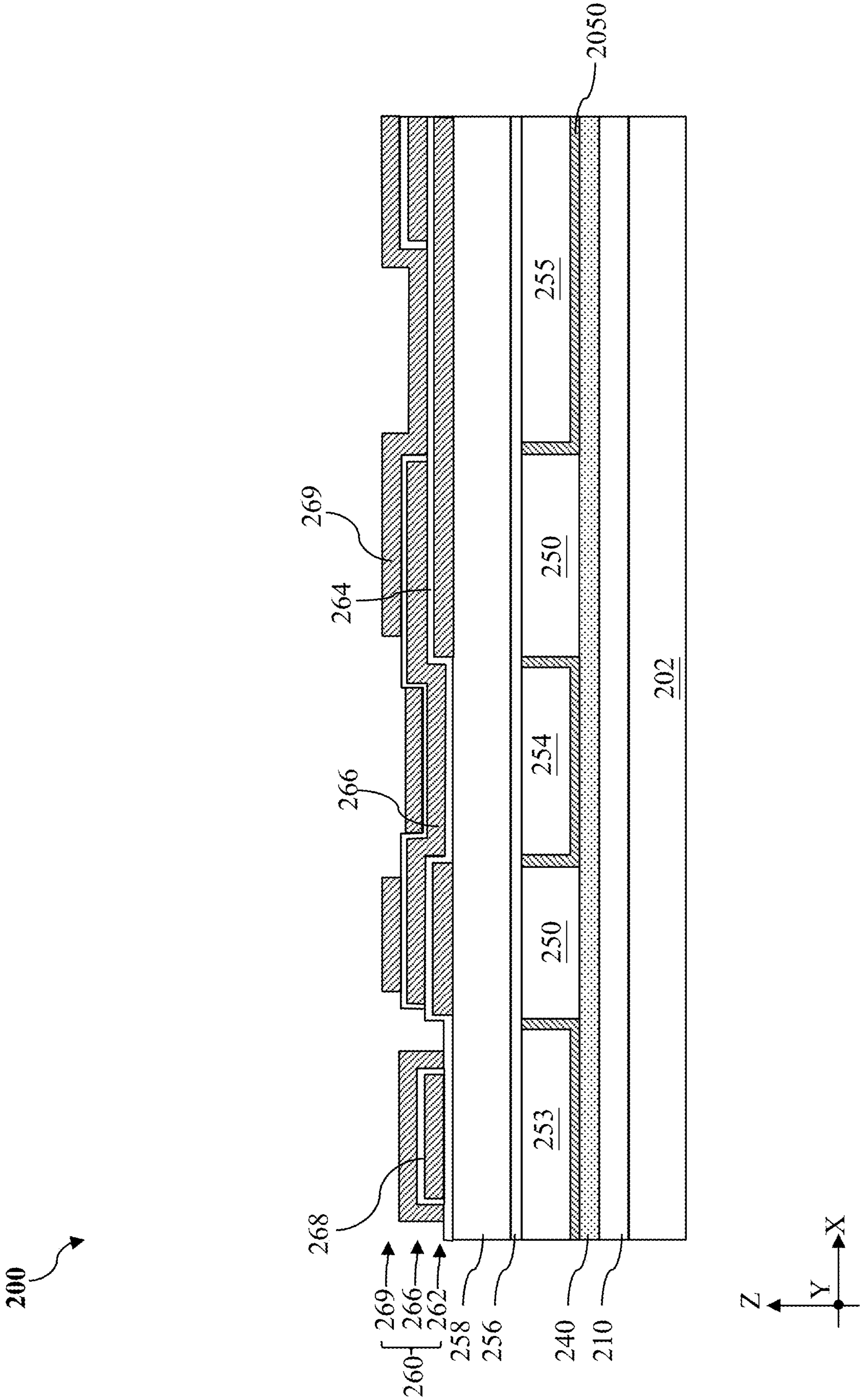

Referring to FIGS. 1 and 4-8, method 100 includes a block 106 where a metal-insulator-metal (MIM) structure 260 (shown in FIG. 8) is formed over the first passivation layer 258. As shown in FIGS. 4-8, forming the MIM structure 260 involves multiple processes, including those for formation and patterning of a bottom conductor plate layer 262, a middle conductor plate layer 266, and a top conductor plate layer 269. Referring first to FIG. 4, a patterned bottom conductor plate layer 262 is formed on the first passivation layer 258. Forming the bottom conductor plate layer 262 itself may involve multiple processes such as deposition, photolithography, development, and/or etching, etc. The bottom conductor plate layer 262 may go through surface treatment such as sidewall passivation using a nitrous oxide ($N_2O$) gas. Referring now to FIG. 5, a first insulator layer 264 is formed on the bottom conductor plate layer 262. In an embodiment, the first insulator layer 264 is deposited to have a generally uniform thickness over the top surface of the workpiece 200 (e.g., having about the same thickness on top and sidewall surfaces of the bottom conductor plate layer 262). Referring then to FIG. 6, a patterned middle conductor plate layer 266 is formed on the first insulator layer 264. The middle conductor plate layer 266 may be formed in a way similar to the way the bottom conductor plate layer 262 is formed, but the pattern of the middle conductor plate layer 266 may be different from that of the bottom conductor plate layer 262. Referring now to FIG. 7, a second insulator layer 268 is formed on the middle conductor plate layer 266. In an embodiment, the second insulator layer 268 is deposited to have a generally uniform thickness over the top surface of the workpiece 200 (e.g., having about the same thickness on top and sidewall surfaces of the middle conductor plate layer 266). Referring to FIG. 8, a patterned top conductor plate layer 269 is formed on the second insulator layer 268. The top conductor plate layer 269 may be formed in a way similar to the way the middle conductor plate layer 266 or the bottom conductor plate layer 262 is formed, but the pattern of the top conductor plate layer 269 may be different from that of the middle conductor plate layer 266 or the bottom conductor plate layer 262.

As illustrated in FIG. 8, the MIM structure 260 includes multiple metal layers including the bottom conductor plate layer 262, the middle conductor plate layer 266, and the top conductor plate layer 269, which function as metal plates of capacitors. The MIM structure 260 also includes multiple insulator layers including the first insulator layer 264 disposed between the bottom conductor plate layer 262 and the middle conductor plate layer 266, as well as the second insulator layer 268 disposed between the middle conductor plate layer 266 and the top conductor plate layer 269. The MIM structure 260 is used to implement one or more capacitors, which may be connected to other electric components such as transistors. The multi-layer MIM structure 260 allows capacitors to be closely packed together in both vertical and lateral directions, thereby reducing the amount of lateral space needed for implementing capacitors. As a result, the MIM structure 260 may accommodate super high-density capacitors and may be referred to as an MIM capacitor.

In some embodiments, to increase capacitance values, the first insulator layer 264 and/or the second insulator layer 268 use high-k dielectric material(s) whose k-value is greater than that of silicon oxide. The first and second insulator layers 264 and 268 may be relatively thin to increase capacitance values but maintain minimal thicknesses to avoid potential breakdown of the capacitors in the MIM structure 260. Further, to optimize the capacitor performance, in some embodiments, the first insulator layer 264 (or the second insulator layer 268) is a tri-layer structure including, from bottom to top, a first zirconium oxide ($ZrO_2$) layer, an aluminum oxide ($Al_2O_3$) layer, and a second zirconium oxide ($ZrO_2$) layer.

While the MIM structure 260 depicted in the figures includes three conductor plate layers, the MIM structure 260 may include additional conductor plates. For example, the MIM structure 260 may include four (4), five (5), six (6), or seven (7) conductor plate layers. Like the MIM structure 260 described in the present disclosure, adjacent conductor plates are spaced apart and insulated from one another by at least one insulator layer.

Figure 24:
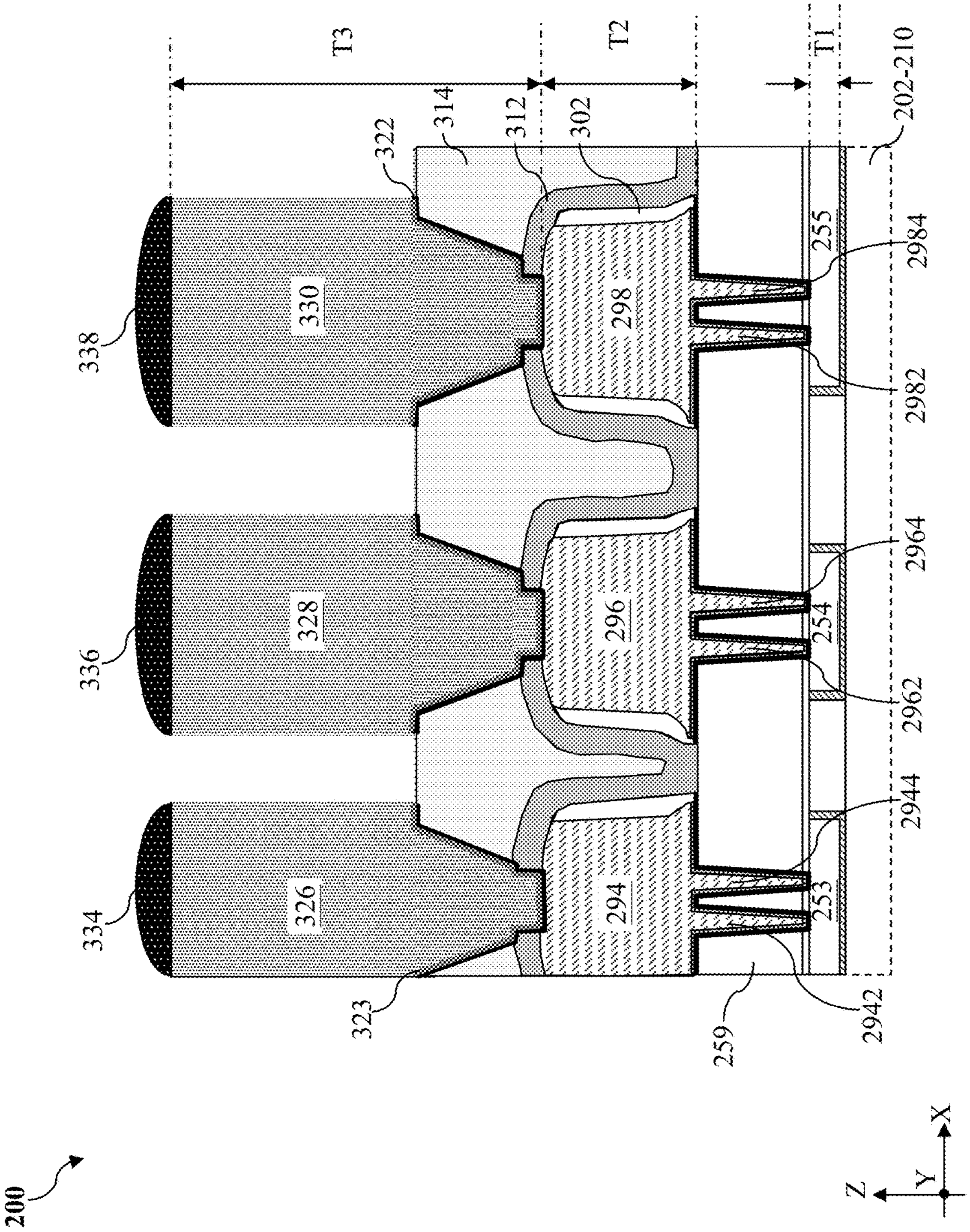
FIGS. 24-27 illustrate alternative semiconductor structures that may be fabricated using the method in FIG. 1, according to embodiments of the present disclosure.

It should be noted that methods and structures of the present disclosure have applications to structures that do not include the MIM structure 260. For example, FIG. 24 illustrates a semiconductor structure 200 where the first passivation layer 258, the MIM structure 260, and the second passivation layer 267 are replaced with a passivation layer 259, which may include silicon oxide, silicon nitride, or a suitable dielectric material.

Figure 9:
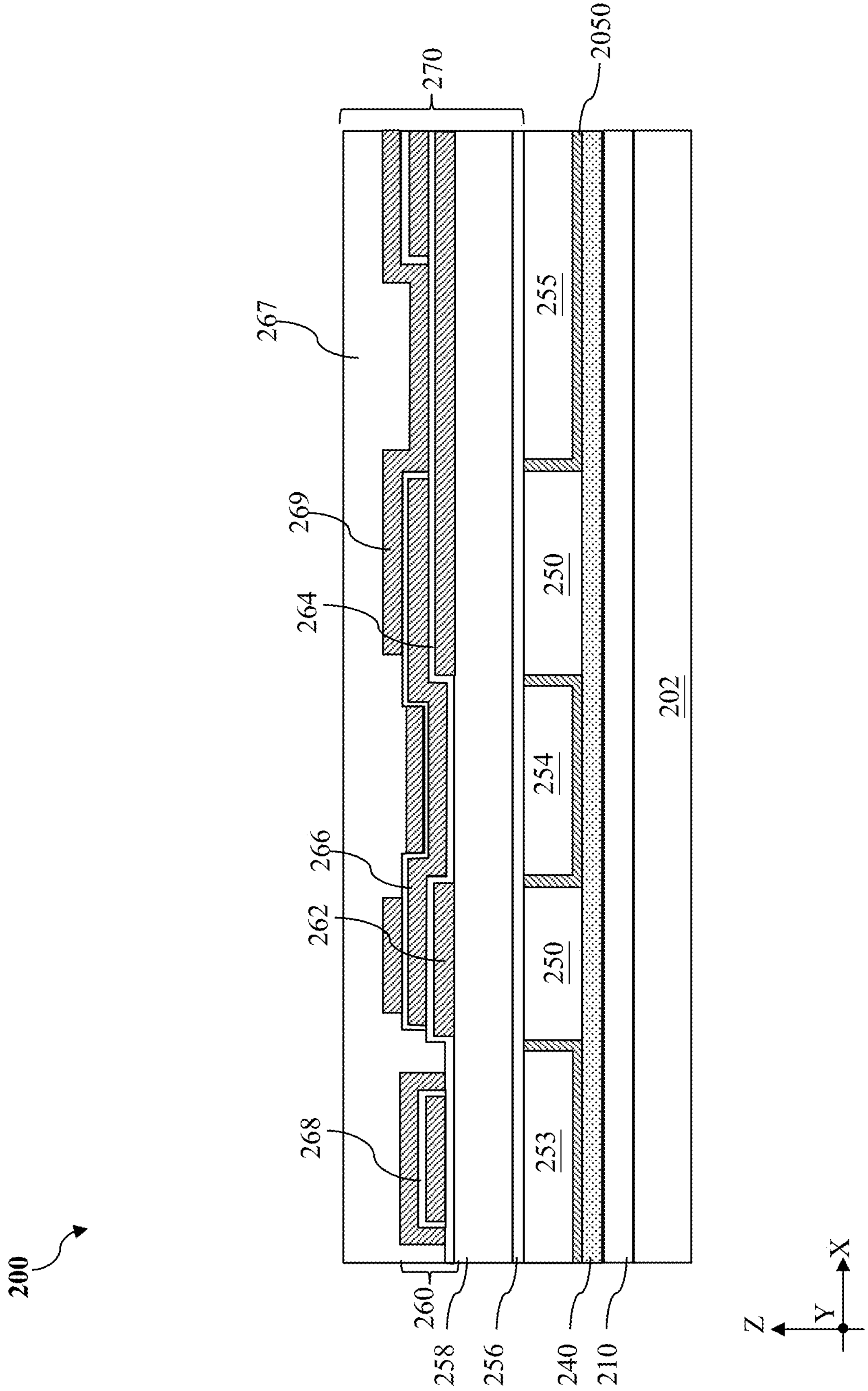

Referring to FIGS. 1 and 9, method 100 includes a block 108 where a second passivation layer 267 is deposited over the MIM structure 260. In some embodiments, the second passivation layer 267 may be similar to the first passivation layer 258 in terms of formation process, process conditions, precursors, and thickness. For that reason, detailed description of the second passivation layer 267 is omitted for brevity. In some embodiments, the deposition of the second passivation layer 267 is followed by a CMP process to provide a planar top surface. As shown in FIG. 9, the MIM structure 260 is sandwiched between the first passivation layer 258 and the second passivation layer 267 along the Z direction. which may have the same composition. In some embodiments, the second dielectric layer 256, the first passivation layer 258, the MIM structure 260, and the second passivation layer 267 may be collectively referred to as a first passivation structure 270. The first passivation layer 258 and the second passivation layer 267 protect the MIM structures 260 from damages due to stress or crack propagation.

Figure 10:
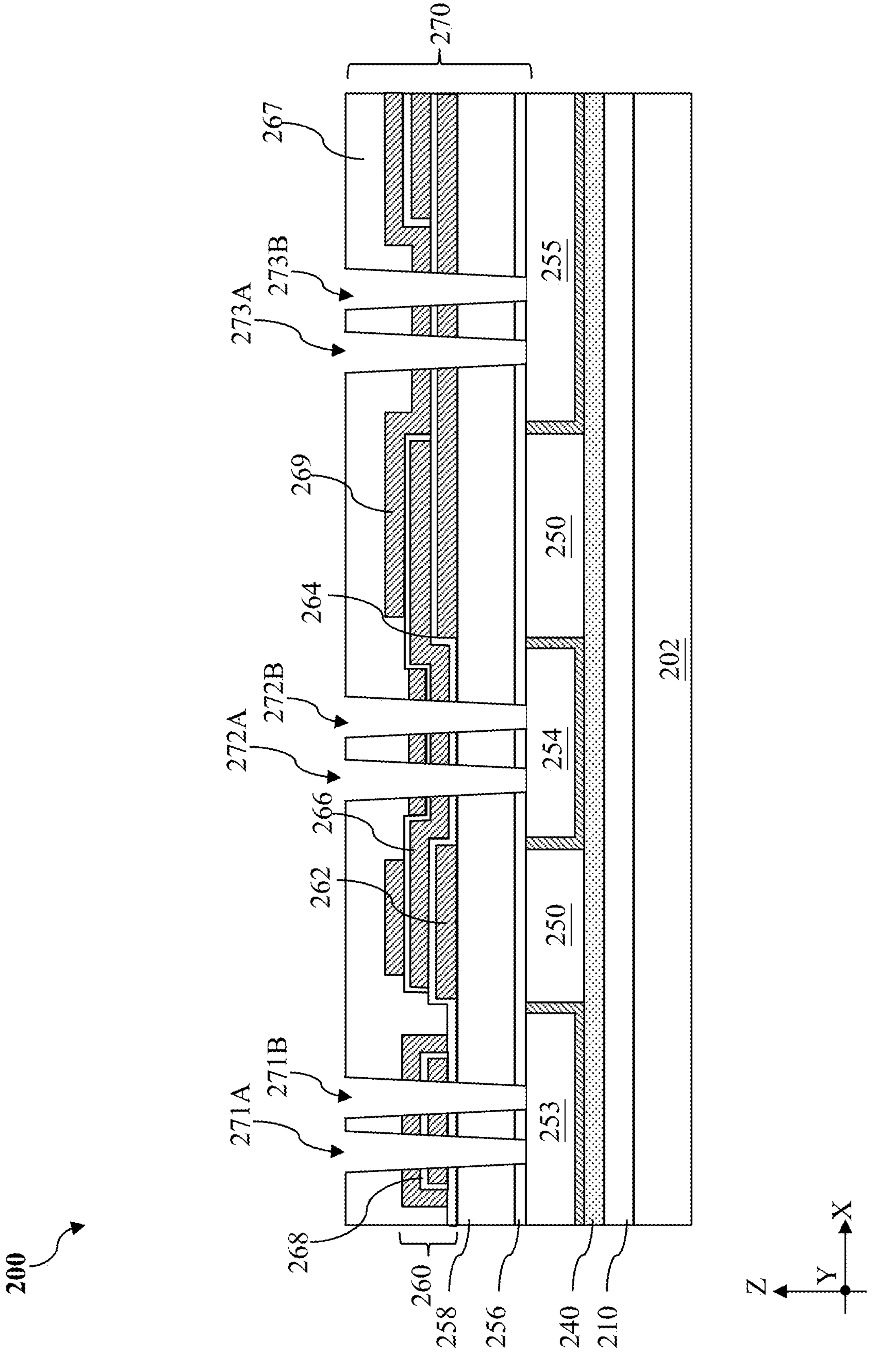

Referring to FIGS. 1 and 10, method 100 includes a block 110 where a plurality of via openings (such as via openings 271A, 271B, 272A, 272B, 273A, and 273B) are formed to penetrate through, from top to bottom, the second passivation layer 267, the MIM structure 260, the first passivation layer 258, and the second dielectric layer 256. In some embodiments represented in FIG. 10, two via openings are formed to expose a single top metal contact. For example, via openings 271A and 271B extend through the first passivation structure 270 to expose the top metal contact 253; via openings 272A and 272B extend through the first passivation structure 270 to expose the top metal contact 254; and via openings 273A and 273B extend through the first passivation structure 270 to expose the top metal contact 255. According to the present disclosure, via openings 271A and 271B are a similarly situated pair, via openings 272A and 272B are a similarly situated pair, and via openings 273A and 273B are a similarly situated pair. In some embodiments, a dry etching process, such as reactive-ion-etching (RIE) is performed to form the openings 271, 272, and 273. Depending on the application, the sidewall of each opening may expose different conductor plate layers of the MIM structure 260. The plurality of via openings (such as via openings 271A, 271B, 272A, 272B, and 273) may be formed using dry etching, such as reactive ion etching (RIE).

In some embodiments, the formation of the plurality of via openings may include use of oxygen, an oxygen-containing gas, hydrogen, a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 11:
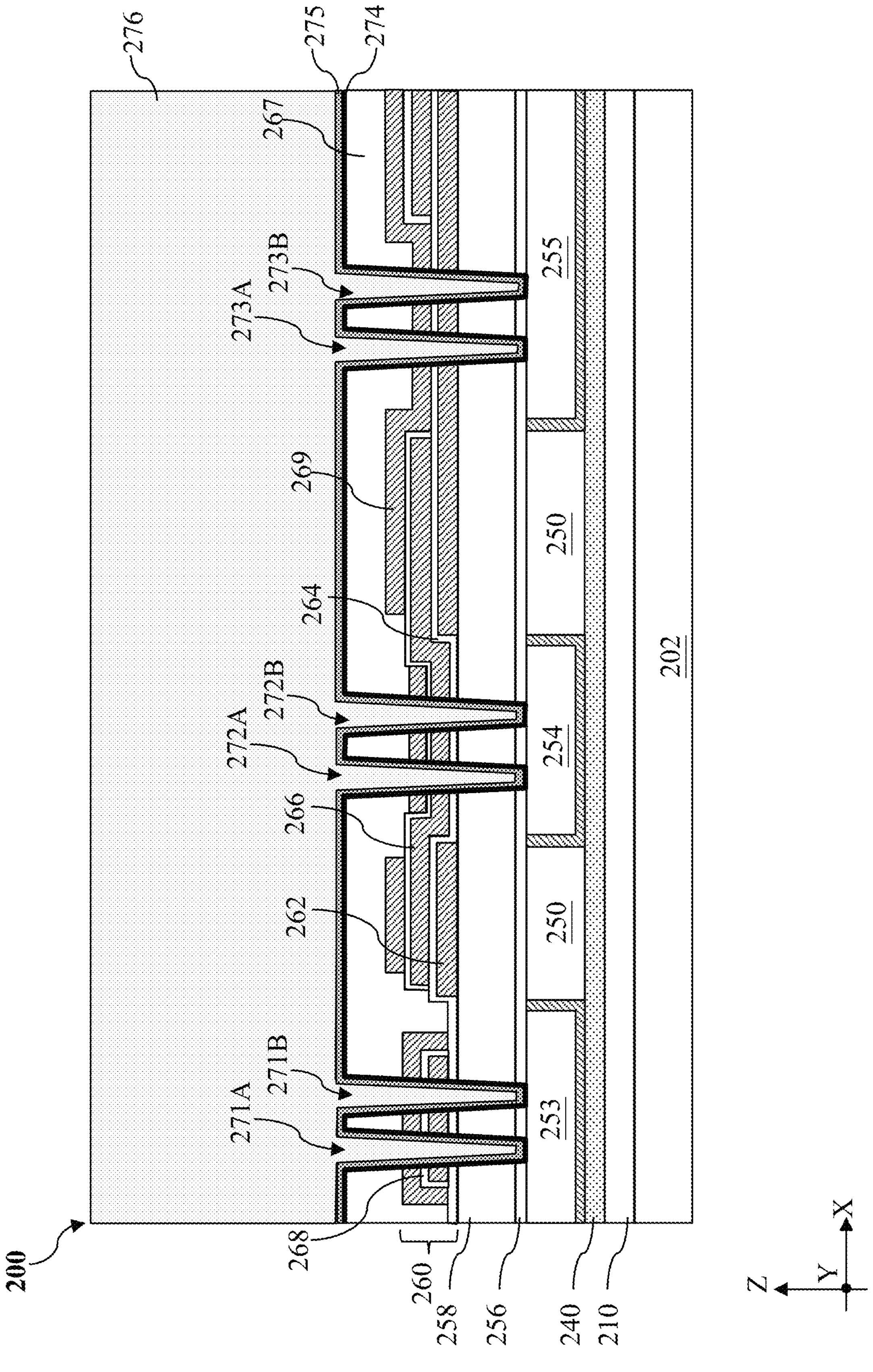

Referring to FIGS. 1 and 11, method 100 includes a block 112 where a barrier layer 274 and a seed layer 275 are formed over the workpiece 200. In some embodiments, the barrier layer 274 may include titanium (Ti), titanium nitride (TiN), tantalum nitride (TaN), tantalum (Ta), tungsten nitride (WN) and the seed layer 275 may include copper (Cu). The barrier layer 274 prevents or reduces electromigration of copper or oxygen diffusion into copper. As shown in FIG. 11, both the barrier layer 274 and the seed layer 275 may be conformally deposited over the second passivation layer 267 and into the via openings 271A, 271B, 272A, 272B, 273A, and 273B using a suitable deposition technique, such as atomic layer deposition (ALD), physical vapor deposition (PVD) or chemical vapor deposition (CVD).

Figure 12:
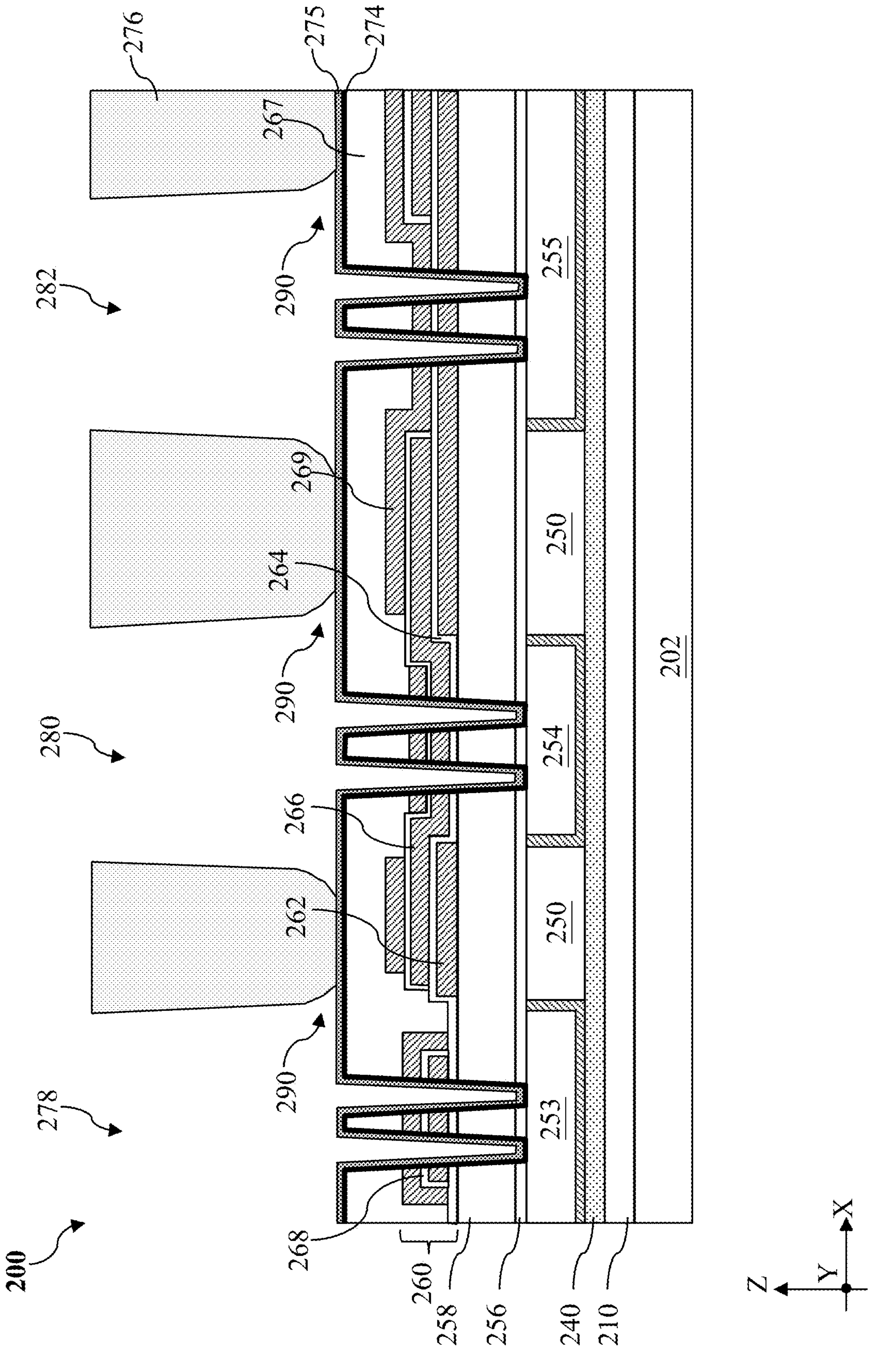

Referring to FIGS. 1 and 11-14, method 100 includes a block 114 where contact vias are formed in the via openings 271A, 271B, 272A, 272B, 273A, and 273B and contact pads 294, 296 and 298 are formed over the via openings. Operations at block 114 may include deposition a first photoresist layer 276 over the workpiece 200 (shown in FIG. 11), patterning the first photoresist layer 276 to form pad openings defined by photoresist features (shown in FIG. 12), depositing a metal fill layer 292 over the via openings and the pad openings (shown in FIG. 13), and removing the photoresist features (shown in FIG. 14). Referring now to FIG. 11, the first photoresist layer 276 may be blanketly deposited over the workpiece 200 using spin-on coating. Referring then to FIG. 12, photolithography techniques are used to pattern the first photoresist layer 276 to form first photoresist features 276 (the same reference numeral is used for ease of reference) that define a first pad opening 278, a second pad opening 280, and a third pad opening 282. As shown in FIG. 12, the first pad opening 278 is in fluid communication with the via openings 271A and 271B, which expose the top metal contact 253. The second pad opening 280 is in fluid communication with the via openings 272A and 272B, which expose the top metal contact 254. The third pad opening 282 is in fluid communication with the via openings 273A and 273B, which expose the top metal contact 255.

In order to form contact pads with wider base portions to prevent stress-induced damages, each of the first pad opening 278, the second pad opening 280 and the third pad opening 282 undercuts the first photoresist features 276. In one example process, the first photoresist layer 276 shown in FIG. 11 is a negative photoresist. During exposure, the upper portion of the first photoresist layer 276 receives more intense irradiation and has a higher extent of crosslinking while the lower portion of the first photoresist layer 276 receives less irradiation and has a lower extent of crosslinking. During the subsequent developing, the developer removes the lower portion faster to form undercuts 290 shown in FIG. 12. Other arrangements are possible and the first photoresist layer 276 may be a positive photoresist in other arrangements.

Figure 13:
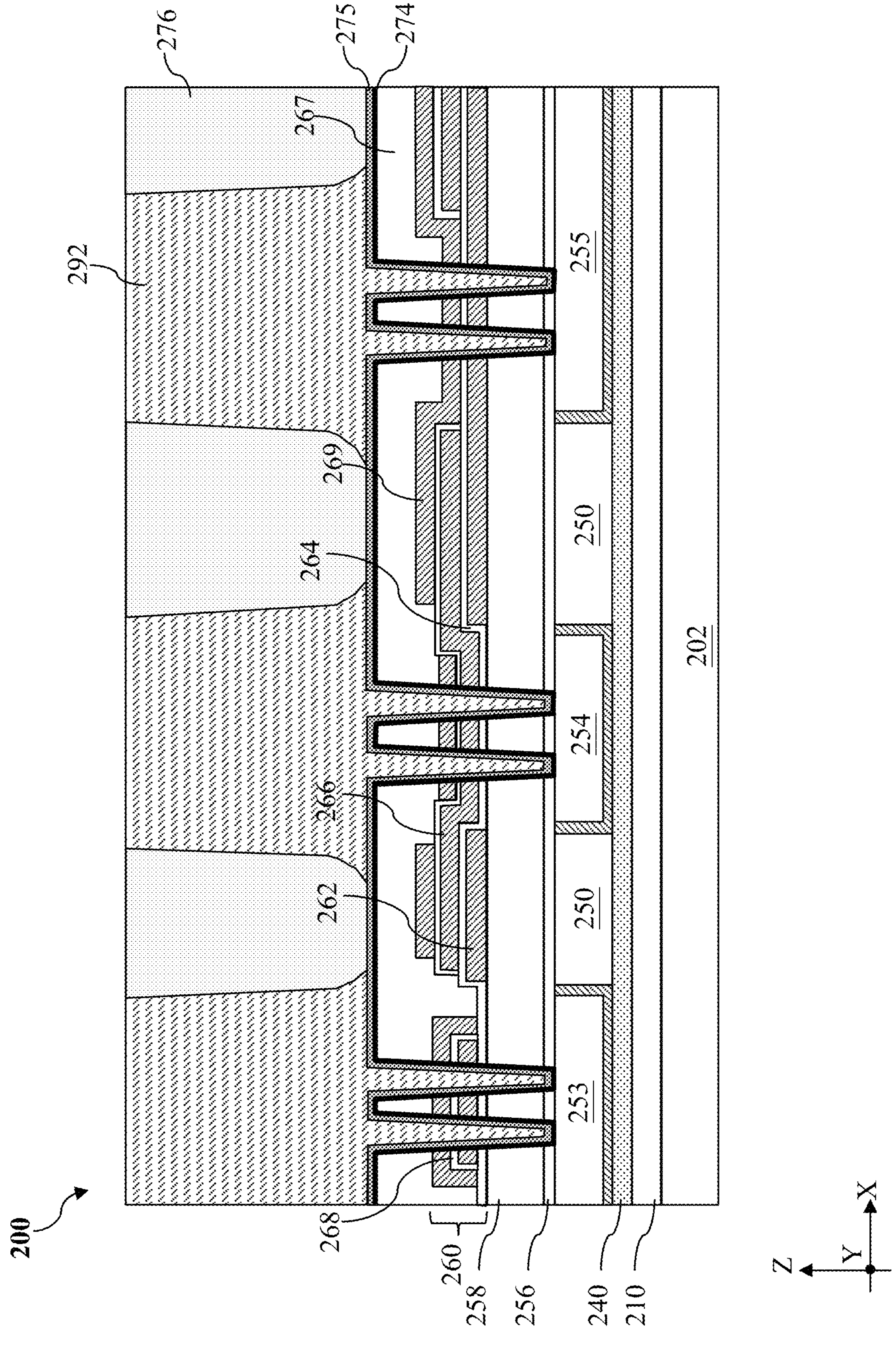

Reference is then made to FIG. 13. After the undercuts 290 are formed, a metal fill layer 292 is deposited on the seed layer 275 using a suitable deposition technique, such as electroplating. The metal fill layer 292 may include copper (Cu), aluminum (Al), or an alloy thereof. In the depicted embodiment, the metal fill layer 292 is formed of copper (Cu). As shown in FIG. 13, the metal fill layer 292 is allowed to fill the via openings 271A, 271B, 272A, 272B, 273A, and 273B as well as the first pad opening 278, the second pad opening 280, and the third pad opening 282. After the deposition of the metal fill layer 292, the workpiece 200 is planarized to remove excess metal fill layer 292 and to provide a planar top surface. The metal fill layer 292 also fills in the undercuts 290.

Figure 14:
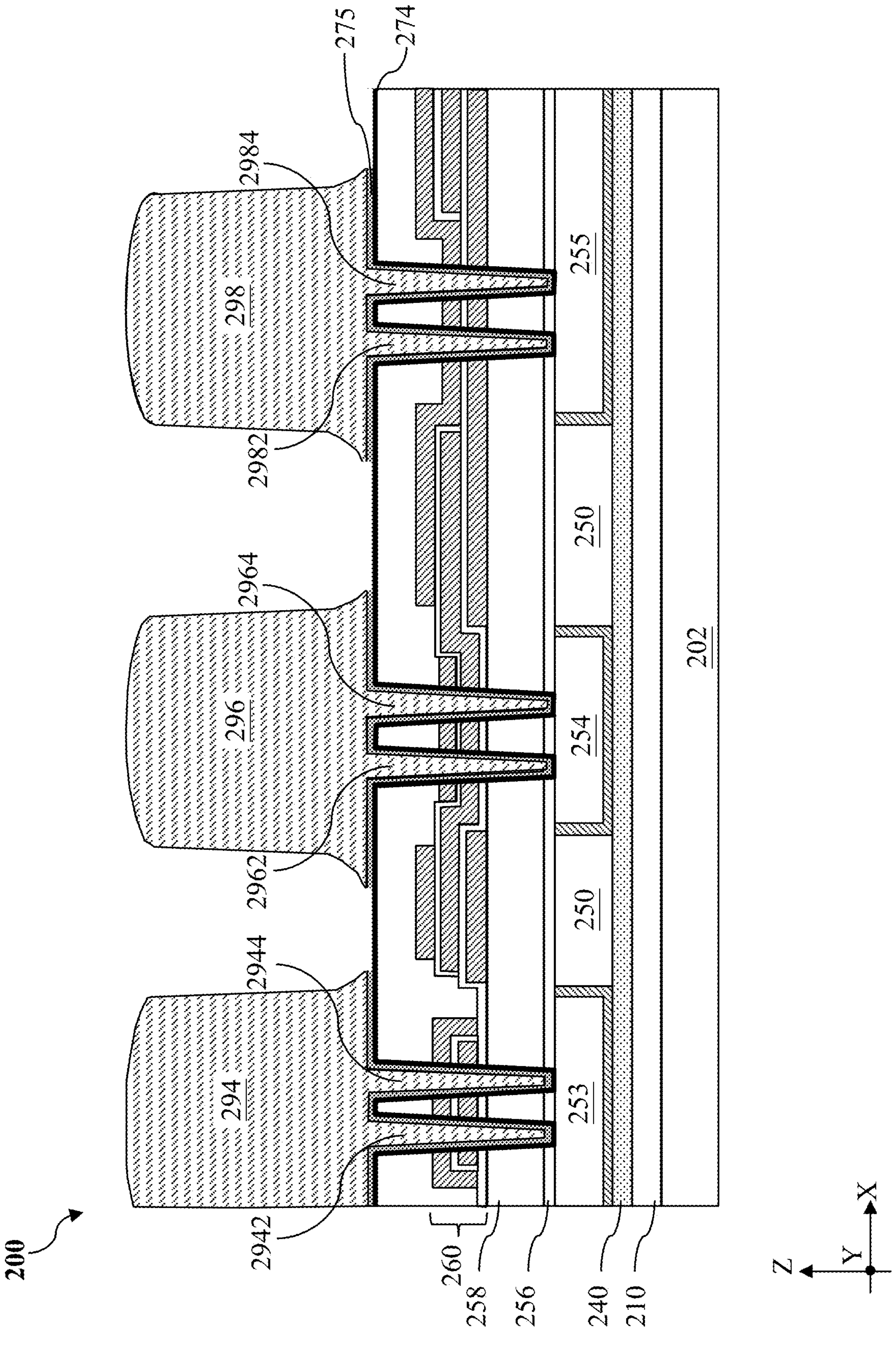

Referring to FIG. 14, the first photoresist features 276 are then selectively removed to form the first contact pad 294, the second contact pad 296, and the third contact pad 298. Additionally, a first contact via 2942 and a second contact via 2944 are formed below and in contact with the first contact pad 294; a third contact via 2962 and a fourth contact via 2964 are formed below and in contact with the second contact pad 296; and a fifth contact via 2982 and a sixth contact via 2984 are formed below and in contact with the third contact pad 298. Because each of the contact pads and the plurality of contact vias below are formed in the same metal fill deposition process shown in FIG. 13, they are continuous structures. Because of formation the undercuts 290 shown in FIG. 12, each of the first contact pad 294, the second contact pad 296, and the third contact pad 298 has a wider base portion along the X direction. In some embodiments shown in FIG. 14, the removal of the photoresist features may also remove the seed layer 275 between adjacent pad features, leaving behind the barrier layer 274.

Figure 15:
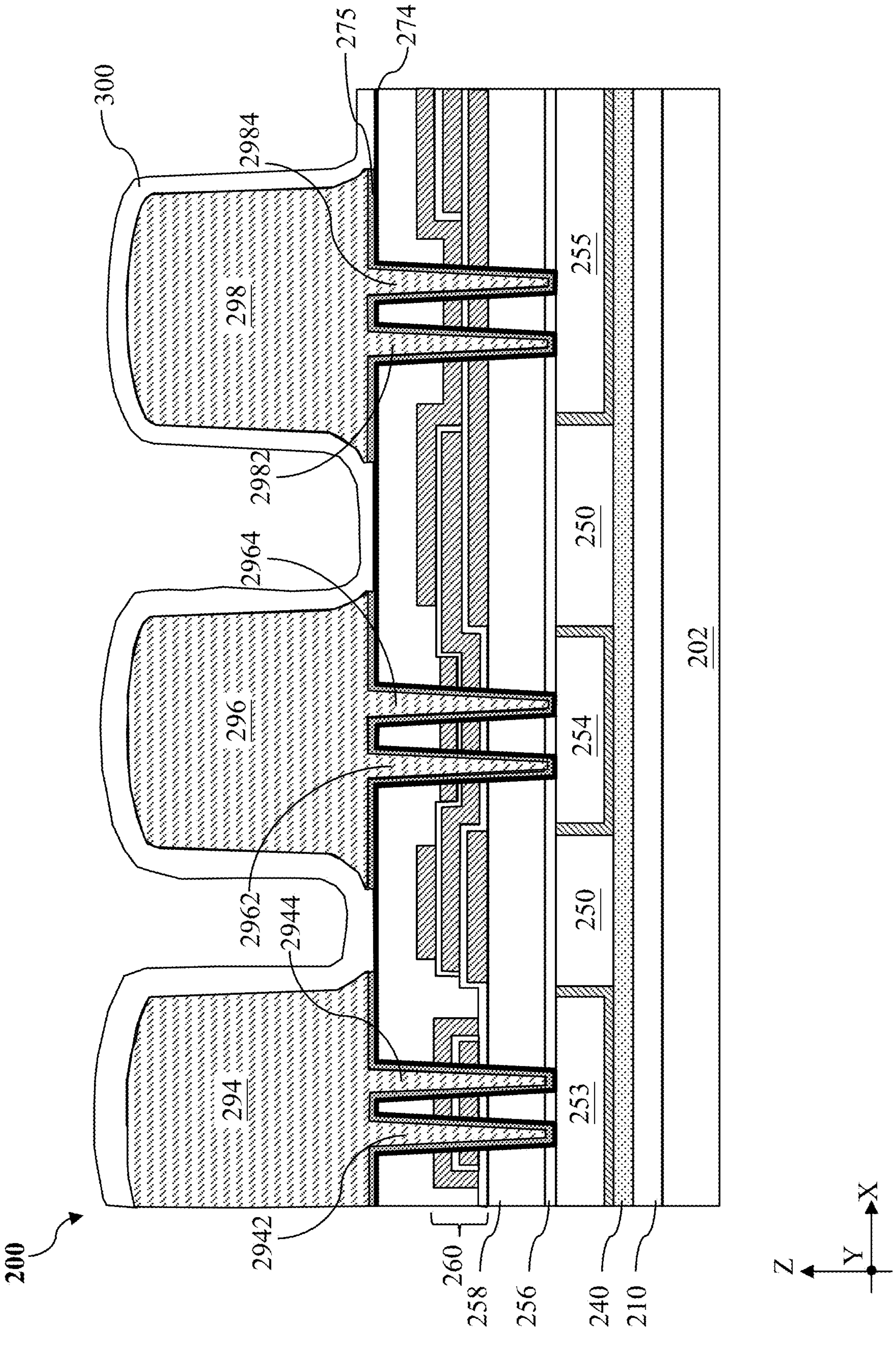

Referring to FIGS. 1 and 15, method 100 includes a block 116 where a protective layer 300 is formed over the workpiece 200, including over the contact pads and the barrier layer 274. In the embodiments represented in FIG. 15, the protective layer 300 may include silicon nitride and may be conformally deposited over the workpiece 200, including over top surfaces and sidewalls of the contact pads and over the barrier layer 274, using PECVD. While the first passivation layer 258, the second passivation layer 267 and the protective layer 300 all include silicon nitride and are all formed using PECVD, the protective layer 300 has a density greater than those in the first passivation layer 258 and the second passivation layer 267. To achieve the higher density of the protective layer 300, a higher radio-frequency (RF) power is applied during the deposition of the protective layer 300. In some instances, the RF power used to deposit the protective layer 300 is about 1.4 time to about 1.6 times of the RF power used to deposit the first passivation layer 258 and the second passivation layer 267. For example, when the RF power used for the deposition of the first passivation layer 258 and the second passivation layer 267 is between about 80 W and about 100 W, the RF power used for the deposition of the protective layer 300 is between about 100 W and about 160 W. Also, in order to achieve the greater density, flow rates of the gaseous precursors used to form the protective layer 300 (which may include ammonia (NH 3), silane (SiH 4), and nitrogen (N 2)) may be 3% to about 10% greater than the flow rates used to deposit the first passivation layer 258 and the second passivation layer 267. In some implementations, the protective layer 300 may be deposited at a process temperature between about 375° C. and about 425° C. and a process pressure between about 2.6 Torr and about 3.0 Torr. In some examples, the protective layer 300 has a thickness between about 2 nm and about 2000 nm. In some instances, a density of the protective layer 300 is about 2.5 times to about 5 times of a density of the first passivation layer 258 and the second passivation layer 267. In other words, a ratio of the density of the protective layer 300 to the density of the first passivation layer 258 and the second passivation layer 267 may be between about 2.5 and about 5. It is observed that the dense protective layer 300 may exert a compressive stress on the contact pads, thereby preventing them to collapse under stress from the overlying solder features.

Figure 16:
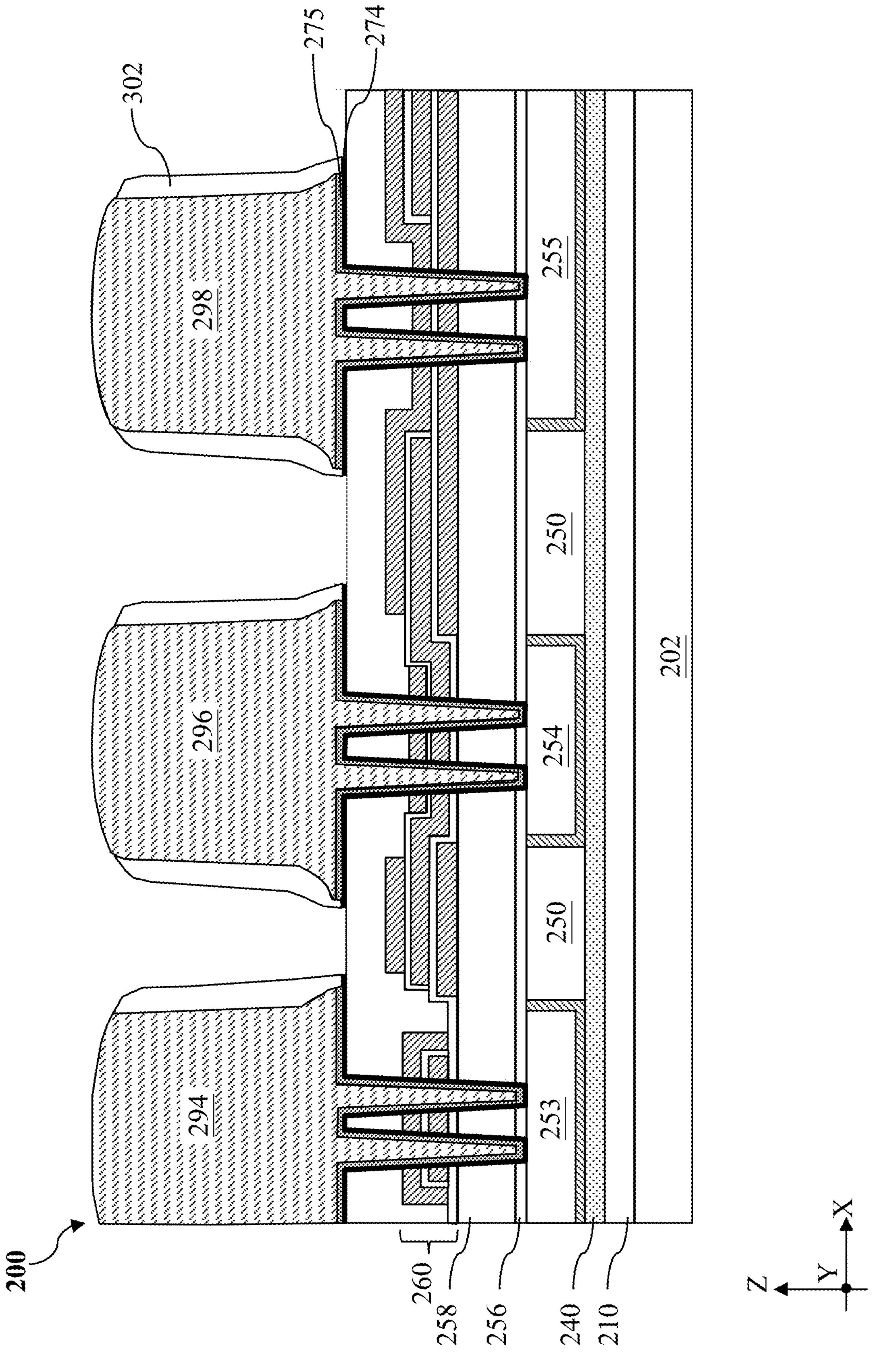

Referring to FIGS. 1 and 16, method 100 includes a block 118 where an etch back is performed. As shown in FIG. 16, the etch back may remove the protective layer 300 deposited on top-facing surfaces, such as the top surfaces of the contact pads (including the first contact pad 294, the second contact pad 296 and the third contact pad 298) and the top surfaces of the barrier layer 274, thereby forming a sidewall protective layer 302. In some alternative embodiments shown in FIG. 25, the protective layer 300 deposited on top surfaces of the contact pads is only thinned but not completely removed. In those alternative embodiments, the sidewall protective layer 302 extends over the top surfaces of the contact pads.

As also shown in FIG. 16, with the protective layer 300 protecting sidewalls of the contact pads (including the first contact pad 294, the second contact pad 296 and the third contact pad 298), the etch back may be performed to remove the barrier layer 274 between the contact pads. The barrier layer 274 is formed of conductive materials and may cause shorts or undesirable electrical connections. The etch back at block 118 removes or at least severs the barrier layer 274 between contact pads to prevent shorts or undesirable electrical connections.

Because both the barrier layer 274 and the protecting layer 300 may include nitride (for example, the barrier layer 274 may include tantalum nitride and the protecting layer 300 may include silicon nitride), the etch back at block 118 may include chemistry that is selective to metal nitride and silicon nitride. In some implementations, the etch back at block 118 may include a dry etch process that uses nitrogen ($N_2$), oxygen ($O_2$), hydrogen ($H_2$), a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 17:
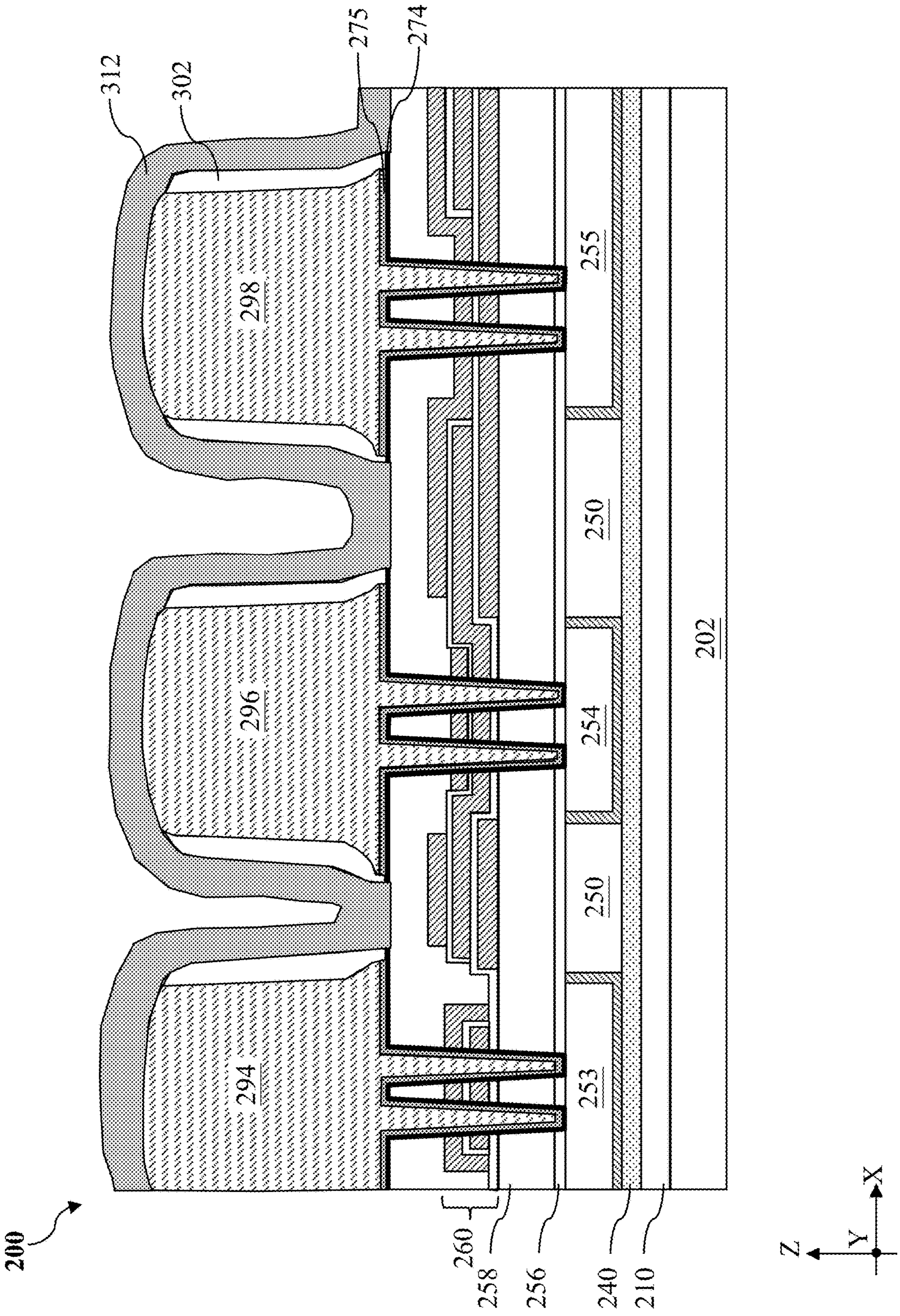
Figure 18:
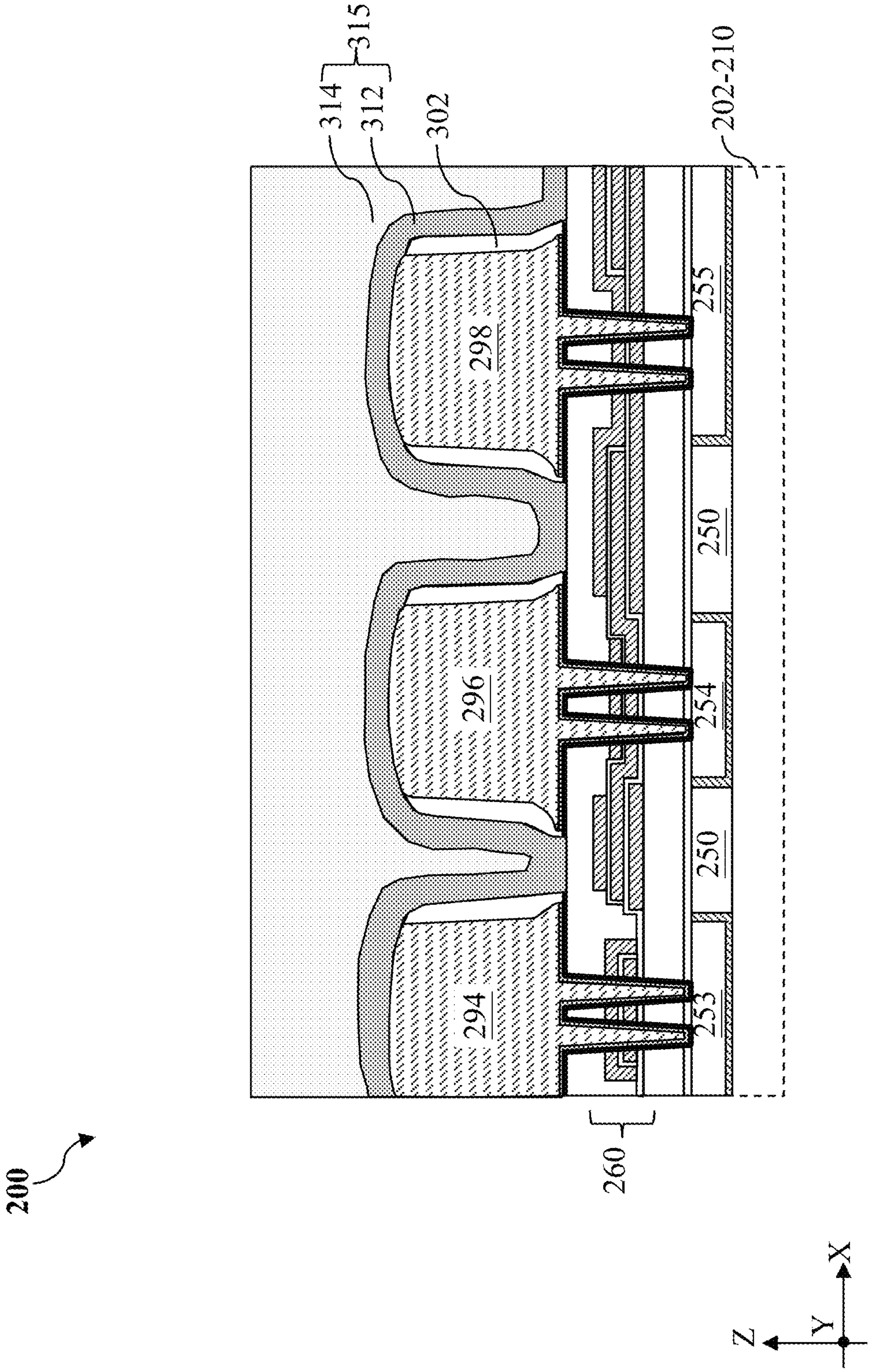

Referring to FIGS. 1, 17 and 18, method 100 includes a block 120 where a second passivation structure 315 is formed over the workpiece 200. In some embodiments, the second passivation structure 315 includes a third passivation layer 312 and a polymer layer 314. In some embodiments, the third passivation layer 312 include silicon nitride (SiN) and may be formed by CVD, PECVD or a suitable method. In some implementations, the third passivation layer 312 may be formed to a thickness between about 25 nm and about 200 nm. The polymer layer 314 is then formed over the third passivation layer 312. In some embodiments, the polymer layer 314 may include polyimide and may be deposited using spin-on coating. As shown in FIG. 17, the third passivation layer 312 is formed over the workpiece 200, including over the sidewall protective layer 302, the contact pads (including the first contact pad 294, the second contact pad 296 and the third contact pad 298), and the second passivation layer 267. In embodiments represented in FIG. 18, the third passivation layer 312 comes in contact with the second passivation layer 267, sidewalls of the barrier layer 274, sidewalls of the seed layer 275, the sidewall protective layer 302 disposed along sidewalls of the upper contact pads, and top surfaces of the contact pads (including the first contact pad 294, the second contact pad 296 and the third contact pad 298).

In some embodiments, the third passivation layer 312 may be similar to the first passivation layer 258 in terms of formation process, process conditions, precursors, and thickness. In some examples, a density of the protective layer 300 is about 2.5 times to about 5 times of a density of the third passivation layer 312. In other words, a ratio of the density of the protective layer 300 to the density of the third passivation layer 312 may be between about 2.5 and about 5.

Referring to FIGS. 1 and 19-23, method 100 includes a block 122 where bump features are formed over the contact pads. Operations at block 122 may include formation of pad access openings through the second passivation structure 315 (shown in FIG. 19), deposition of a barrier layer 322 and a seed layer 323 (shown in FIG. 20), formation of a patterned second photoresist layer 324 (shown in FIG. 21), formation of copper pillars and solder features (shown in FIG. 22), performance of an etch back to remove undesirable portions of the barrier layer 322 and the seed layer 323 (shown in FIG. 23), and reflowing of the solder features (shown in FIG. 23).

Figure 19:
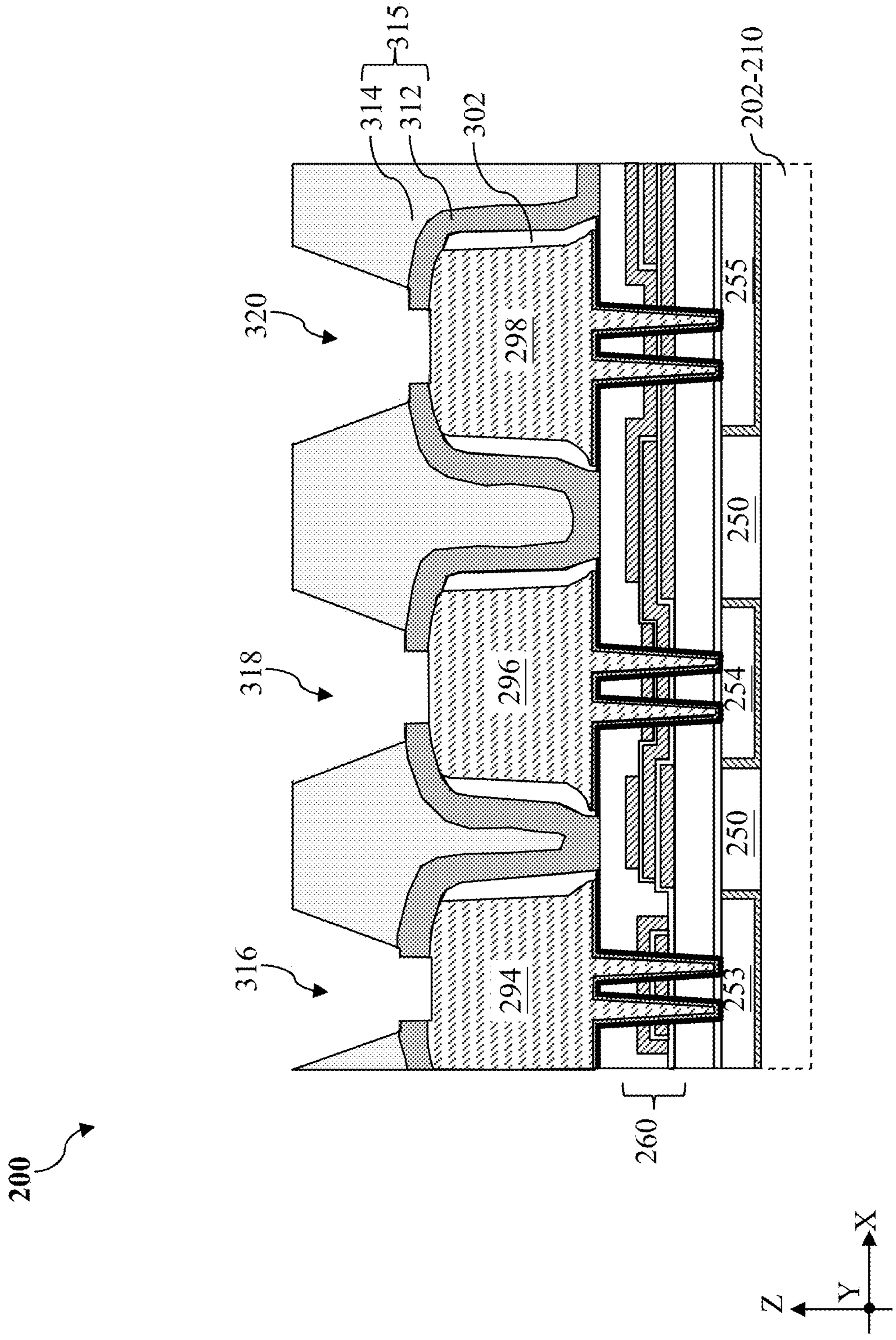

Referring to FIG. 19, pad access openings 316, 318 and 320 are formed through the second passivation structure 315 to expose the first contact pad 294, the second contact pad 296 and the third contact pad 298, respectively. In some embodiments, a dry etch process may be performed to etch through the polymer layer 314 and the third passivation layer 312. An example dry etch process may include use of hydrogen ($H_2$), a fluorine-containing gas (e.g., $CF_4$, $SF_6$, $NF_3$, $BF_3$, $CH_2F_2$, CHF 3, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas. As shown in FIG. 19, because the etch rate of the polymer layer 314 is greater than that of the third passivation layer 312, each of the pad access openings 316, 318 and 320 has a wider opening in the polymer layer 314 and a narrower opening in the third passivation layer 312.

Figure 20:
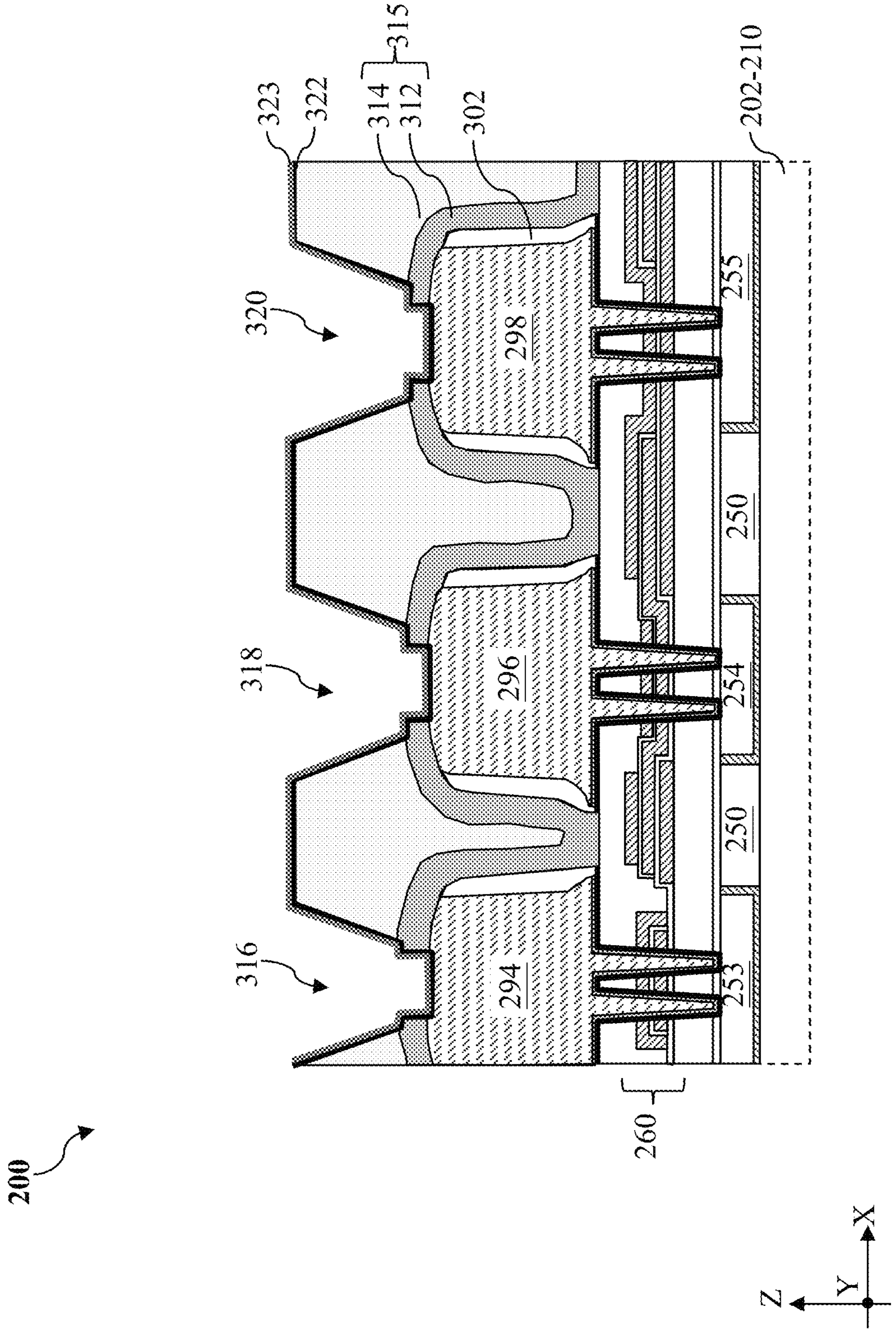

Referring to FIG. 20, the barrier layer 322 may include titanium (Ti), titanium nitride (TiN), tantalum nitride (TaN), tantalum (Ta), tungsten nitride (WN) and the seed layer 323 may include copper (Cu). The barrier layer 322 prevents or reduces electromigration of copper or oxygen diffusion into copper. As shown in FIG. 20, both the barrier layer 322 and the seed layer 323 may be conformally deposited over the pad access openings 316, 318 and 320, including on the exposed portions of the first contact pad 294, the second contact pad 296 and the third contact pad 298. The barrier layer 322 and the seed layer 323 may be deposited using a suitable deposition technique, such as atomic layer deposition (ALD), physical vapor deposition (PVD) or chemical vapor deposition (CVD).

Figure 21:
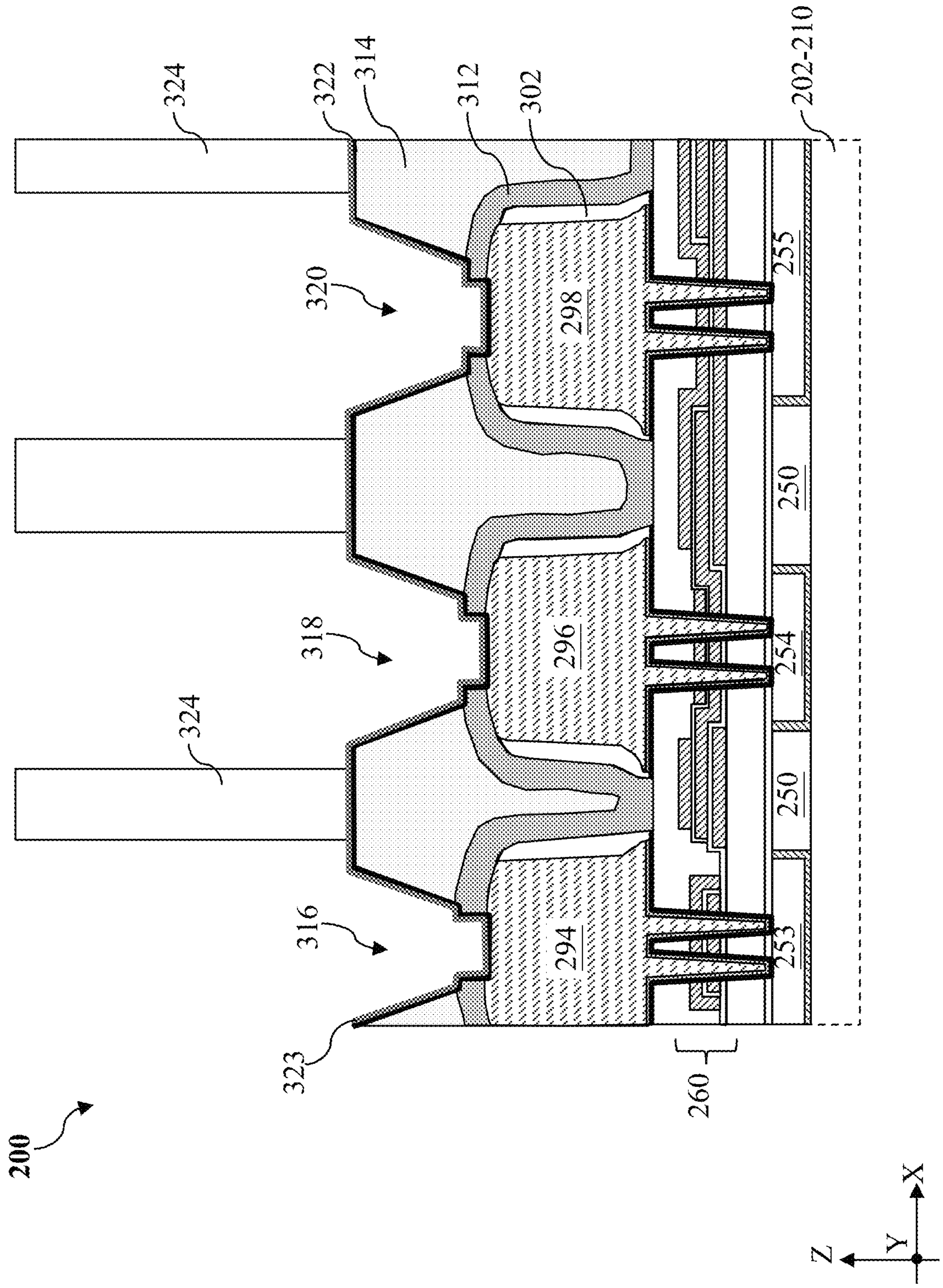

Referring to FIG. 21, the patterned second photoresist layer 324 is formed over the workpiece 200 to define boundaries of the to-be-formed copper pillars and solder features. In an example process, a second photoresist layer is blanketly deposited over the workpiece 200 using spin-on coating. As shown in FIG. 21, photolithography techniques are used to pattern the second photoresist layer 324 to form photoresist features around the pad access openings 316, 318 and 320.

Figure 22:
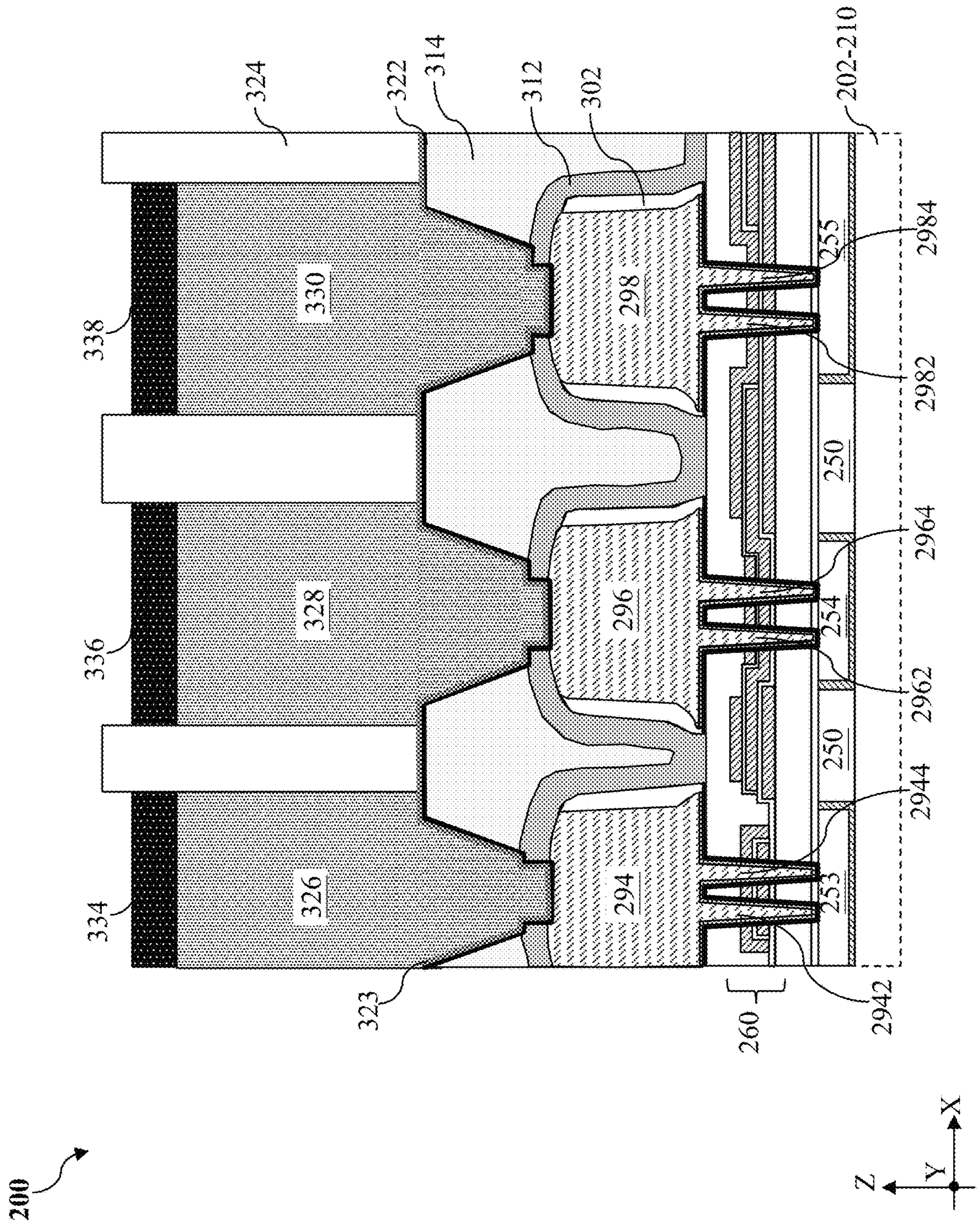

Referring to FIG. 22, copper pillars 326, 328 and 330 and solder features 334, 336 and 338 are formed over the pad access openings while being confined by the patterned photoresist layer 324. In some embodiments, the copper pillars 326, 328 and 330 may include copper (Cu), cobalt (Co), nickel (Ni), or a combination thereof and may be deposited on the exposed seed layer 323 using electroplating. After the deposition of the copper pillars 326, 328 and 330, solder features 334, 336 and 338 are deposited over each of the copper pillars 326, 328 and 330, respectively. In some embodiments, after the deposition of the solder features 334, 336 and 338, the top surface of the patterned second photoresist layer 324 is still higher than the top surface of the solder feature 334, 336 and 338. That is the patterned second photoresist layer 324 still separates the copper pillars 326, 328 and 330 as well as the solder features 334, 336 and 338 deposited thereon. In some implementations, the solder feature 334, 336 and 338 may include nickel (Ni), tin (Sn), tin-lead (SnPb), gold (Au), silver (Ag), palladium (Pd), indium (In), nickel-palladium-gold (NiPdAu), nickel-gold (NiAu), SnAg, SnPb, SnAgCu, or other suitable metal alloy. After the deposition of the copper pillars 326, 328 and 330 as well as the solder features 334, 336 and 338, the patterned second photoresist layer 324 are removed by ashing or selective etching.

Figure 23:
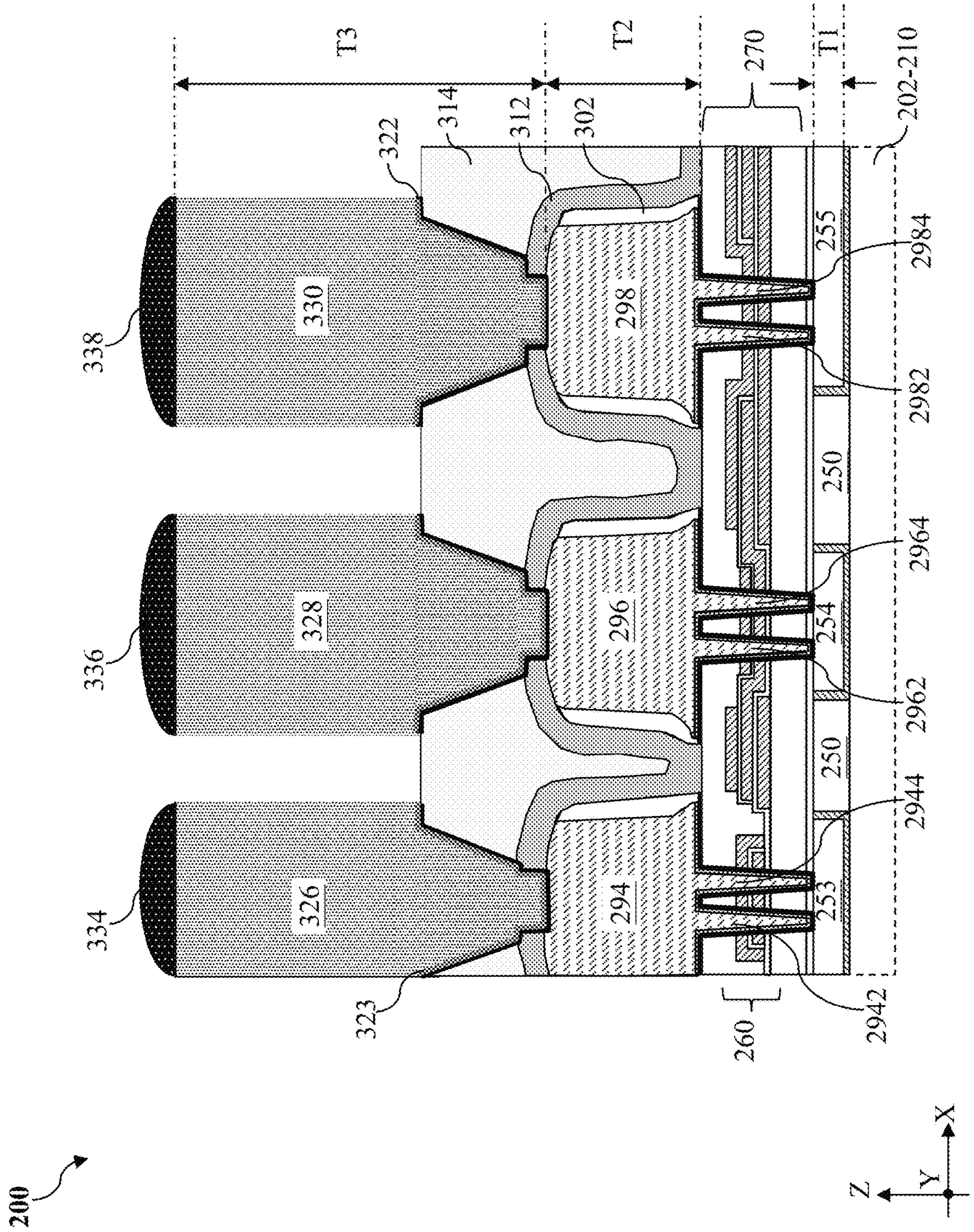

Referring to FIG. 23, to remove the excess barrier layer 322 and the seed layer 323 electrically coupling the copper pillars 326, 328 and 330, an etch back is performed to the workpiece 200. In some implementations, the etch back at block 122 may include a dry etch process that uses nitrogen ($N_2$), oxygen ($O_2$), hydrogen ($H_2$), a fluorine-containing gas (e.g., $CF_4$, $SF_6$, $NF_3$, $BF_3$, $CH_2F_2$, $CHF_3$, $CH_3F$, $C_4H_8$, $C_4F_6$, and/or $C_2F_6$), a carbon-containing gas (e.g., CO, $CH_4$, and/or $C_3H_8$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. After the etch back, the solder features 334, 336 and 338 are reflowed to form the bump-like shapes.

Reference is still made to FIG. 23. It is observed that the contact pads have to be thicker than the top metal contacts to prevent damages to the MIM structure 260 and the top metal contacts. In the depicted embodiments, along the Z direction, the top metal contacts 253, 254 and 255 have a first thickness T1 and the contact pads 294, 296 and 298 have a second thickness T2. The second thickness T2 is between about 5 times and about 10 times of the first thickness T1. This range is not trivial. It has been observed that when the second thickness T2 is less than 5 times of the first thickness T1, the MIM structure 260 and/or the top metal contacts are prone to damages caused by the stress at the solder features. When the second thickness T2 is greater than 10 times of the first thickness T1, the additional thickness no longer contributes to the stress distribution function of the contact pads. To provide sufficient room for formation of encapsulation or underfill, the copper pillars 326, 328 and 330 tend to have a third thickness T3 that is greater than the second thickness T2. As shown in FIG. 24, the third thickness T3 of the copper pillars 326, 328 and 330 is measured from the respective bottom surface of the copper pillars to the respective top surface thereof. In some embodiments, the third thickness T3 is about 1.5 times to about 4 times of the second thickness T2.

FIG. 24 illustrates an alternative embodiment where the semiconductor structure 200 does not include the MIM structure 260. As shown in FIG. 24, the first passivation layer 258, the MIM structure 260 and the second passivation layer 267 are replaced with a passivation layer 259. The passivation layer 259 may include silicon oxide or silicon nitride. In one embodiment, the passivation layer 259 includes silicon oxide.

Figure 25:
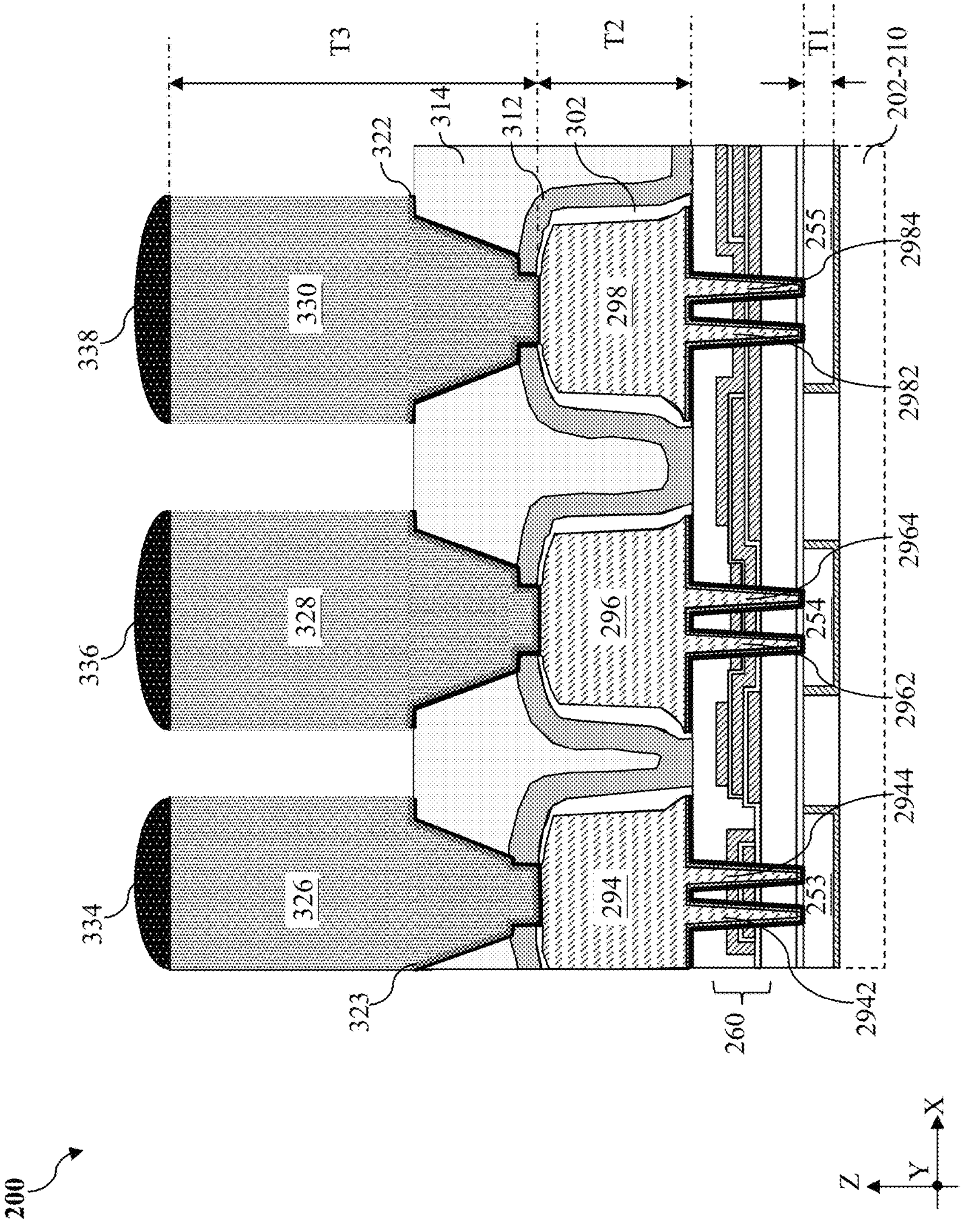

FIG. 25 illustrates an alternative embodiment where a portion of the sidewall protective layer 302 extends to the top surfaces of the contact pads 294, 296 and 298. Compared to the semiconductor structure 200 shown in FIG. 23, the sidewall protective layer 302 in FIG. 25 is subject to be less aggressive etch back process such that a portion of the sidewall protective layer 302 extends continuously over the top surfaces of the contact pads 294, 296 and 298. Due to the nature of the etch back processes, the portion of the sidewall protective layer 302 over the top surfaces is thinner than the portion of the sidewall protective layer 302 extending along sidewalls of the contact pads 294, 296 and 298.

Figure 26:
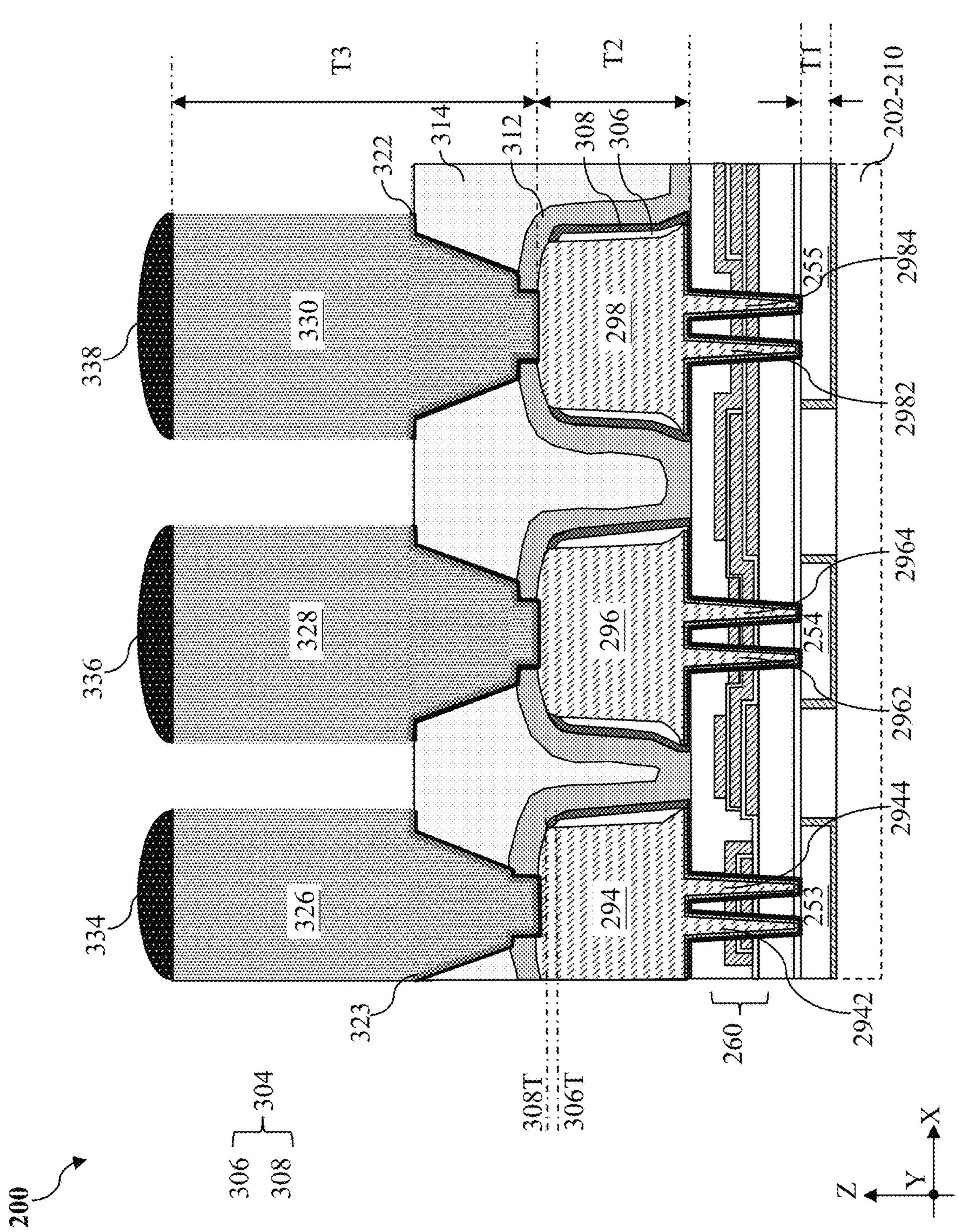

FIG. 26 illustrates another alternative embodiment where the sidewall protective layer includes a multilayer sidewall protective layer 304. In the depicted embodiment, the multilayer sidewall protective layer 304 includes an inner layer 306 and an outer layer 308. Both the inner layer 306 and the outer layer 308 are similar to the protective layer 300 in terms of deposition processes and density. The outer layer 308 covers the top surfaces of the inner layer 306. None of the inner layer 306 and the outer layer 308 extends over the top surfaces of the contact pads 294, 296 and 298. In an example process, a dielectric layer for the inner layer 306 is conformally deposited over the contact pads 294, 296 and 298 and is subject to an etch back process similar to the operations at block 118 described above to remove the inner layer 306 over the top surfaces of the contact pads. After the etch back of the inner layer, a dielectric layer for the outer layer 308 is conformally deposited over the contact pads 294, 296 and 298 and is subject to an etch back process similar to the operations at block 118 described above. Because the barrier layer 274 and seed layer 275 between the contact pads have been removed during the etch back for the inner layer 306, the etch back of the outer layer 308 may be less aggressive, leaving the top surfaces of the contact pads covered by the outer layer 308. As a result, a top surface 308T of the outer layer 308 is higher than a top surface 306T of the inner layer 306. Additionally, the top surfaces of the inner layer 306 resulting from the etch back process are now covered by the outer layer 308.

Figure 27:
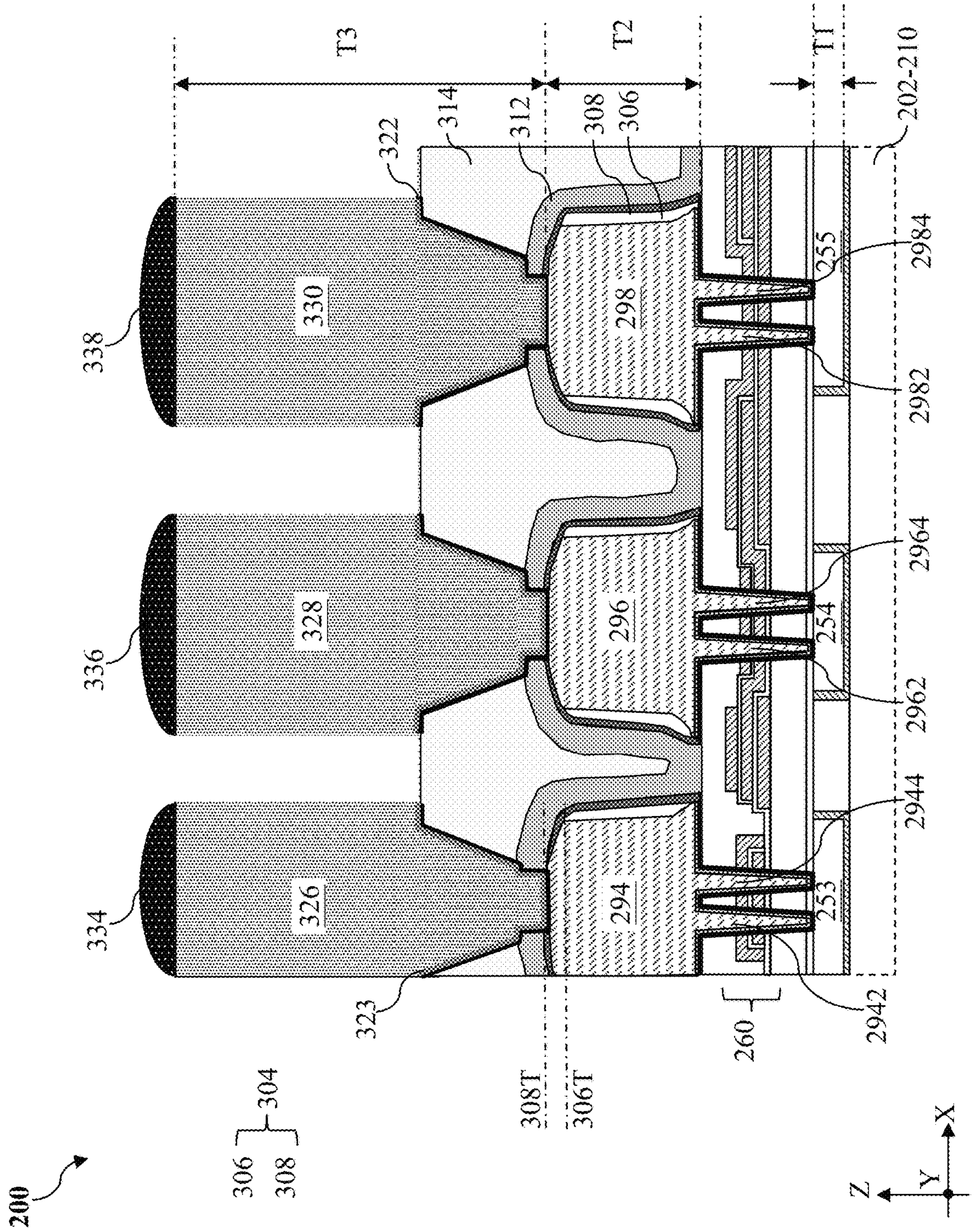

FIG. 27 illustrates yet another alternative embodiment where the sidewall protective layer includes a multilayer sidewall protective layer 304. In the depicted embodiment, the multilayer sidewall protective layer 304 includes an inner layer 306 and an outer layer 308. Both the inner layer 306 and the outer layer 308 are similar to the protective layer 300 in terms of deposition processes and density. The outer layer 308 covers the top surfaces of the inner layer 306 and a portion of the outer layer 308 remains disposed over the top surfaces of the contact pads 294, 296 and 298. In an example process, a dielectric layer for the inner layer 306 is conformally deposited over the contact pads 294, 296 and 298 using processes similar to those described in block 116 of method 100 and is subject to an etch back process similar to the operations at block 118 of method 100 to remove the inner layer 306 over the top surfaces of the contact pads. After the etch back of the inner layer 306, a dielectric layer for the outer layer 308 is conformally deposited over the contact pads 294, 296 and 298 and is subject to an etch back process similar to the operations at block 118 described above. Because the barrier layer 274 and seed layer 275 between the contact pads have been removed during the etch back for the inner layer 306, the etch back of the outer layer 308 may be less aggressive, leaving the top surfaces of the contact pads covered by the outer layer 308. As a result, a top surface 308T of the outer layer 308 is higher than a top surface 306T of the inner layer 306. Additionally, the top surfaces of the inner layer 306 resulting from the etch back process are now covered by the outer layer 308.

One aspect of the present disclosure involves semiconductor structure. The semiconductor structure includes a metal feature in a dielectric layer, a passivation structure over the dielectric layer and the metal feature, a contact pad over the passivation structure, and a plurality of contact vias extending through the passivation structure and in contact with the metal feature and the contact pad. The metal feature includes a first thickness and the contact pad includes a second thickness greater than the first thickness.

In some embodiments, the passivation structure includes a first passivation layer, a metal-insulator-metal (MIM) capacitor disposed over and in contact with the first passivation layer, and a second passivation layer disposed over and in contact with the MIM capacitor. In some implementations, the MIM capacitor includes a plurality of conductive plates interleaved by a plurality of insulation layers and the plurality of contact vias extend through at least one of the plurality of conductive plates. In some instances, the first passivation layer and the second passivation layer include silicon nitride. In some embodiments, the semiconductor structure further includes a protective layer disposed along sidewalls of the contact pad. The protective layer includes an inner layer disposed on the sidewalls of the contact pad, and an outer layer disposed on the inner layer. The outer layer is in contact with the inner layer and the sidewalls of the contact pad. In some embodiments, a highest surface of the outer layer is higher than a highest surface of the inner layer. In some embodiments, the inner layer and the outer layer include silicon nitride. In some implementations, a ratio of the second thickness to the first thickness is between about 5 and about 10.

Another aspect of the present disclosure involves a semiconductor structure. The semiconductor structure includes a metal feature in a dielectric layer, a passivation structure over the dielectric layer and the metal feature, a contact pad over the passivation structure, more than one contact via extending through the passivation structure and in contact with the metal feature and the contact pad, a protective layer disposed along sidewalls of the contact pad, a top passivation layer disposed over the contact pad, the passivation structure, and the protective layer, a polymer layer disposed over the top passivation layer, and a conductive pillar extending through the polymer layer and the top passivation layer to contact the contact pad.

In some embodiments, the top passivation layer and the protective layer include silicon nitride, the top passivation layer has a first density, and the protective layer has a second density greater than the first density. In some embodiments, a ratio of the second density to the first density is between about 2.5 and about 5. In some implementations, a thickness of the top passivation layer is between about 5 μm and about 15 μm and a thickness of the protective layer is between about 2 nm and about 2000 nm. In some instances, the passivation structure includes a first passivation layer, a metal-insulator-metal (MIM) capacitor disposed over and in contact with the first passivation layer, and a second passivation layer disposed over and in contact with the MIM capacitor. In some implementations, the first passivation layer, the second passivation layer and the protective layer include silicon nitride, the first passivation layer and the second passivation layer have a first density, and the protective layer has a second density greater than the first density. In some embodiments, a ratio of the second density to the first density is between about 2.5 and about 5.

Still another aspect of the present disclosure involves a method. The method includes providing a workpiece that includes a metal feature and a passivation structure over the metal feature, forming a plurality of via openings through the passivation structure to expose the metal feature, depositing a seed layer over the workpiece and the plurality of via openings, depositing a first photoresist layer over the seed layer, patterning the first photoresist layer to form a pad opening in the first photoresist layer over the plurality of via openings to undercuts the patterned first photoresist layer, depositing a conductive layer over the pad opening and the plurality of via openings, removing the patterned first photoresist layer to form a plurality of contact vias in the plurality of via openings and a contact pad over and in contact with the plurality of contact vias, and forming a protective layer along sidewalls of the contact pad.

In some embodiments, the method further includes before the depositing of the first photoresist layer, depositing a barrier layer over the workpiece and the plurality of via openings, and depositing a seed layer over the barrier layer. In some embodiments, the forming of the protective layer includes depositing an inner protective layer over the contact pad, etching back the deposited inner protective layer, after the etching back of the deposited inner protective layer, depositing an outer protective layer over the inner protective layer, and etching back the deposited outer protective layer. In some implementations, the inner protective layer and the outer protective layer include silicon nitride. In some implementations, the passivation structure includes a first passivation layer, a metal-insulator-metal (MIM) capacitor disposed over and in contact with the first passivation layer, and a second passivation layer disposed over and in contact with the MIM capacitor. The first passivation layer, the second passivation layer and the protective layer include silicon nitride. The first passivation layer and the second passivation layer have a first density and the protective layer has a second density greater than the first density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a metal feature in a dielectric layer;

a passivation structure over the dielectric layer and the metal feature;

a contact pad over the passivation structure; and a plurality of contact vias extending through the passivation structure and in contact with the metal feature and the contact pad, wherein the metal feature comprises a first thickness, wherein the contact pad comprises a second thickness greater than the first thickness, wherein a ratio of the second thickness to the first thickness is between about 5 and about 10.

2. The semiconductor structure of claim 1, wherein the passivation structure includes:
a first passivation layer;
a metal-insulator-metal (MIM) capacitor disposed over and in contact with the first passivation layer; and
a second passivation layer disposed over and in contact with the MIM capacitor.

3. The semiconductor structure of claim 2,
wherein the MIM capacitor includes a plurality of conductive plates interleaved by a plurality of insulation layers,
wherein the plurality of contact vias extend through at least one of the plurality of conductive plates.

4. The semiconductor structure of claim 2, wherein the first passivation layer and the second passivation layer comprise silicon nitride.

5. The semiconductor structure of claim 2, further comprising:
a protective layer disposed along sidewalls of the contact pad, wherein the protective layer comprises:
an inner layer disposed on the sidewalls of the contact pad, and
an outer layer disposed on the inner layer, wherein the outer layer is in contact with the inner layer and the sidewalls of the contact pad.

6. The semiconductor structure of claim 5, wherein a highest surface of the outer layer is higher than a highest surface of the inner layer.

7. The semiconductor structure of claim 5, wherein the inner layer and the outer layer comprise silicon nitride.

8. A semiconductor structure, comprising:
a metal feature in a dielectric layer;
a passivation structure over the dielectric layer and the metal feature;
a contact pad over the passivation structure;
more than one contact via extending through the passivation structure and in contact with the metal feature and the contact pad;
a protective layer disposed along sidewalls of the contact pad;
a top passivation layer disposed over the contact pad, the passivation structure, and the protective layer;
a polymer layer disposed over the top passivation layer; and
a conductive pillar extending through the polymer layer and the top passivation layer to contact the contact pad,
wherein the top passivation layer and the protective layer comprise silicon nitride,
wherein the top passivation layer has a first density,
wherein the protective layer has a second density greater than the first density.

9. The semiconductor structure of claim 8, wherein a ratio of the second density to the first density is between about 2.5 and about 5.

10. The semiconductor structure of claim 8,
wherein a thickness of the top passivation layer is between about 5 μm and about 15 μm,
wherein a thickness of the protective layer is between about 2 nm and about 2000 nm.

11. The semiconductor structure of claim 8, wherein the passivation structure includes:
a first passivation layer;
a metal-insulator-metal (MIM) capacitor disposed over and in contact with the first passivation layer; and
a second passivation layer disposed over and in contact with the MIM capacitor.

12. The semiconductor structure of claim 11,
wherein the first passivation layer, the second passivation layer and the protective layer comprise silicon nitride,
wherein the first passivation layer and the second passivation layer have a first density,
wherein the protective layer has a second density greater than the first density.

13. The semiconductor structure of claim 12, wherein a ratio of the second density to the first density is between about 2.5 and about 5.

14. A semiconductor structure, comprising:
a metal feature in a dielectric layer;
a passivation structure over the dielectric layer and the metal feature;
a contact pad over the passivation structure;
a plurality of contact vias extending through the passivation structure to electrically connect the metal feature and the contact pad;
a top passivation layer disposed over the contact pad and the passivation structure;
a polymer layer disposed over the top passivation layer; and
a conductive pillar extending through the polymer layer and the top passivation layer to contact the contact pad,
wherein the metal feature comprises a first thickness along a vertical direction,
wherein the contact pad comprises a second thickness along the vertical direction,
wherein the conductive pillar comprise a third thickness along the vertical direction,
wherein the third thickness is greater than the second thickness,
wherein the second thickness is greater than the first thickness.

15. The semiconductor structure of claim 14, wherein a ratio of the second thickness to the first thickness is between about 5 and about 10.

16. The semiconductor structure of claim 14, wherein a ratio of the third thickness to the second thickness is between about 1.5 and about 4.

17. The semiconductor structure of claim 14, wherein the passivation structure includes:
a first passivation layer;
a metal-insulator-metal (MIM) capacitor disposed over and in contact with the first passivation layer; and
a second passivation layer disposed over and in contact with the MIM capacitor.

18. The semiconductor structure of claim 14, wherein a bottom surface of the contact pad is spaced apart from the passivation structure by a barrier layer and a seed layer.

19. The semiconductor structure of claim 5,
wherein the first passivation layer and the protective layer comprise silicon nitride,
wherein the first passivation layer has a first density,
wherein the protective layer has a second density greater than the first density.

20. The semiconductor structure of claim 8, further comprising:
a barrier layer disposed between the conductive pillar and the top passivation layer as well as between the conductive pillar and the polymer layer,
wherein the barrier layer comprises titanium (Ti), titanium nitride (TiN), tantalum nitride (TaN), tantalum (Ta), or tungsten nitride (WN).

* * * * *